United States Patent
Pearson et al.

(10) Patent No.: US 12,417,363 B2
(45) Date of Patent: Sep. 16, 2025

(54) TERMINALS AND METHODS OF USE AND MANUFACTURE THEREOF

(71) Applicant: Metropolis IP Holdings, LLC, Santa Monica, CA (US)

(72) Inventors: Gregory Scott Pearson, Nashville, TN (US); Gregory Richard Mason, Iowa City, IA (US)

(73) Assignee: Metropolis IP Holdings, LLC, Santa Monica, CA (US)

( * ) Notice: Subject to any disclaimer, the term of this patent is extended or adjusted under 35 U.S.C. 154(b) by 0 days.

(21) Appl. No.: 18/119,760

(22) Filed: Mar. 9, 2023

(65) Prior Publication Data

US 2023/0289542 A1    Sep. 14, 2023

Related U.S. Application Data

(60) Provisional application No. 63/318,014, filed on Mar. 9, 2022.

(51) Int. Cl.
| | |
|---|---|
| *G06K 7/10* | (2006.01) |
| *G06K 7/14* | (2006.01) |
| *H05K 5/00* | (2006.01) |
| *H05K 5/02* | (2006.01) |

(52) U.S. Cl.
CPC ....... *G06K 7/10366* (2013.01); *G06K 7/1413* (2013.01); *H05K 5/0018* (2022.08); *H05K 5/0213* (2013.01)

(58) Field of Classification Search
CPC .................................................. G06K 7/10366
USPC ................................................ 235/440, 451
See application file for complete search history.

(56) References Cited

U.S. PATENT DOCUMENTS

| | | | | |
|---|---|---|---|---|
| 7,075,427 | B1* | 7/2006 | Pace | B61L 23/06 |
| | | | | 246/126 |
| 8,845,125 | B1* | 9/2014 | Lumsden | B61L 29/04 |
| | | | | 362/249.02 |
| 2004/0226993 | A1 | 11/2004 | Fulcher et al. | |
| 2011/0145141 | A1* | 6/2011 | Blain | B60L 53/65 |
| | | | | 235/382 |
| 2011/0203901 | A1 | 8/2011 | King et al. | |
| 2012/0283012 | A1* | 11/2012 | Bainbridge | G07F 17/3216 |
| | | | | 463/30 |
| 2012/0292385 | A1 | 11/2012 | Mackay et al. | |
| 2013/0117078 | A1 | 5/2013 | Weik, III et al. | |
| 2023/0237884 | A1* | 7/2023 | Qadri | G06Q 20/18 |
| | | | | 235/383 |

FOREIGN PATENT DOCUMENTS

| | | |
|---|---|---|
| KR | 10-1537753 B1 | 7/2015 |
| WO | WO-2024030701 A1 * | 2/2024 |

OTHER PUBLICATIONS

International Search Report and Written Opinion issued in PCT/US2023/014923 dated Jun. 29, 2023, 9 pgs.

(Continued)

*Primary Examiner* — Toan C Ly
(74) *Attorney, Agent, or Firm* — Fenwick & West LLP

(57) ABSTRACT

Devices and methods are provided for use in controlling access to a parking garage or other restricted area. More specifically, the device relates to a parking terminal to control access to vehicles in a parking area and the method relates to installing and servicing the parking terminal in a desired location without the need for specialized tools.

19 Claims, 36 Drawing Sheets

(56) References Cited

OTHER PUBLICATIONS

International Preliminary Report on Patentability and Written Opinion of the International Searching Authority dated Sep. 10, 2024; 6 pgs.

* cited by examiner

Section B-B

Section A-A

TERMINALS AND METHODS OF USE AND MANUFACTURE THEREOF

CROSS REFERENCE TO RELATED APPLICATIONS

This application claims the benefit of priority to U.S. Provisional Application No. 63/318,014 filed Mar. 9, 2022, the content of which is hereby incorporated by reference.

COPYRIGHT NOTICE

Copyright 2022 S P Plus Corporation. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 C.F.R. § 1.71(d).

FIELD OF THE DISCLOSURE

The present disclosure generally relates to systems, methods, and associated devices for use in controlling access to a restricted area. More particularly, the present disclosure relates to a terminal for controlling access by vehicles to a parking area and methods of use and manufacture thereof. In embodiments, a novel terminal is provided.

BRIEF SUMMARY OF THE DISCLOSURE

This summary is provided to introduce a selection of concepts in a simplified form that are further described in the detailed description of the disclosure. This summary is not intended to identify key or essential inventive concepts of the claimed subject matter, nor is it intended for determining the scope of the claimed subject matter.

Generally, a parking terminal as disclosed herein may include one or more outer panels and a hood. In embodiments, the hood is sloped and extends above a front face of the terminal.

In embodiments of the present disclosure, a terminal comprises at least one outer panel; a hood located above at least one outer panel; and an inner panel located on a front face of the terminal below the hood, the inner panel comprising one or more reader devices; wherein a top surface of the hood is angled at least 26 degrees from horizontal.

In embodiments, the hood extends past the inner panel on the front face of the terminal. In embodiments, the terminal further comprises a back face with a first vent located on the back face of the at least one outer panel; and a second vent located between the hood and the inner panel. In embodiments, the hood is wider proximate the front face than proximate the back face. In embodiments, a drain is located on the front face between at least one outer panel and the inner panel and wherein a channel is disposed proximate the vent on an interior surface of the inner panel and is angled such that a first end of the channel is lower than an opposite second end of the channel and wherein the first end is closer to the drain than the second end.

BRIEF DESCRIPTION OF THE SEVERAL VIEWS OF THE DRAWING(S)

The foregoing summary, as well as the following detailed description of the disclosure, is better understood when read in conjunction with the appended drawings. For the purpose of illustrating the disclosure, exemplary constructions of the inventions of the disclosure are shown in the drawings. However, the disclosure and the inventions herein are not limited to the specific methods and instrumentalities disclosed herein.

FIG. 1 exemplarily illustrates a front view of a first embodiment of a terminal.

Figure 8:
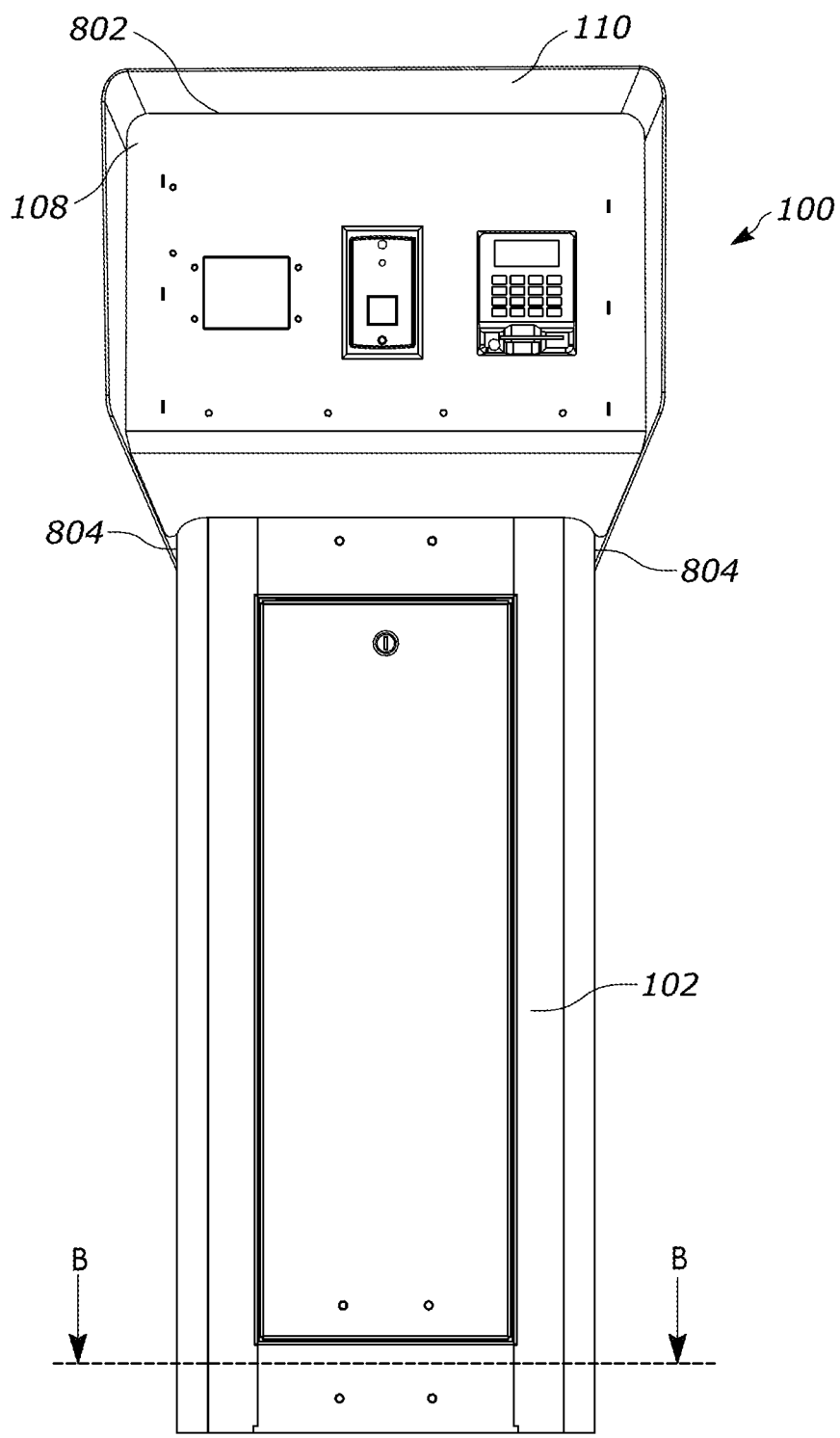

FIG. 8 exemplarily illustrates a front view of a third embodiment of a terminal.

Figure 9:
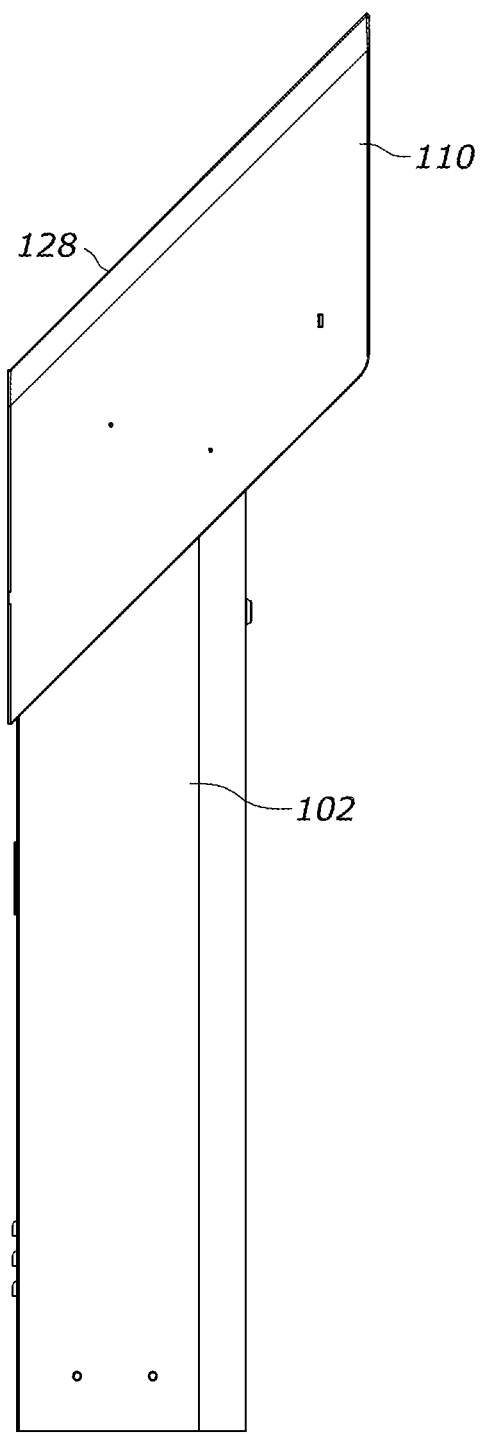

FIG. 9 is a side view of the terminal of FIG. 8.

Figure 10:
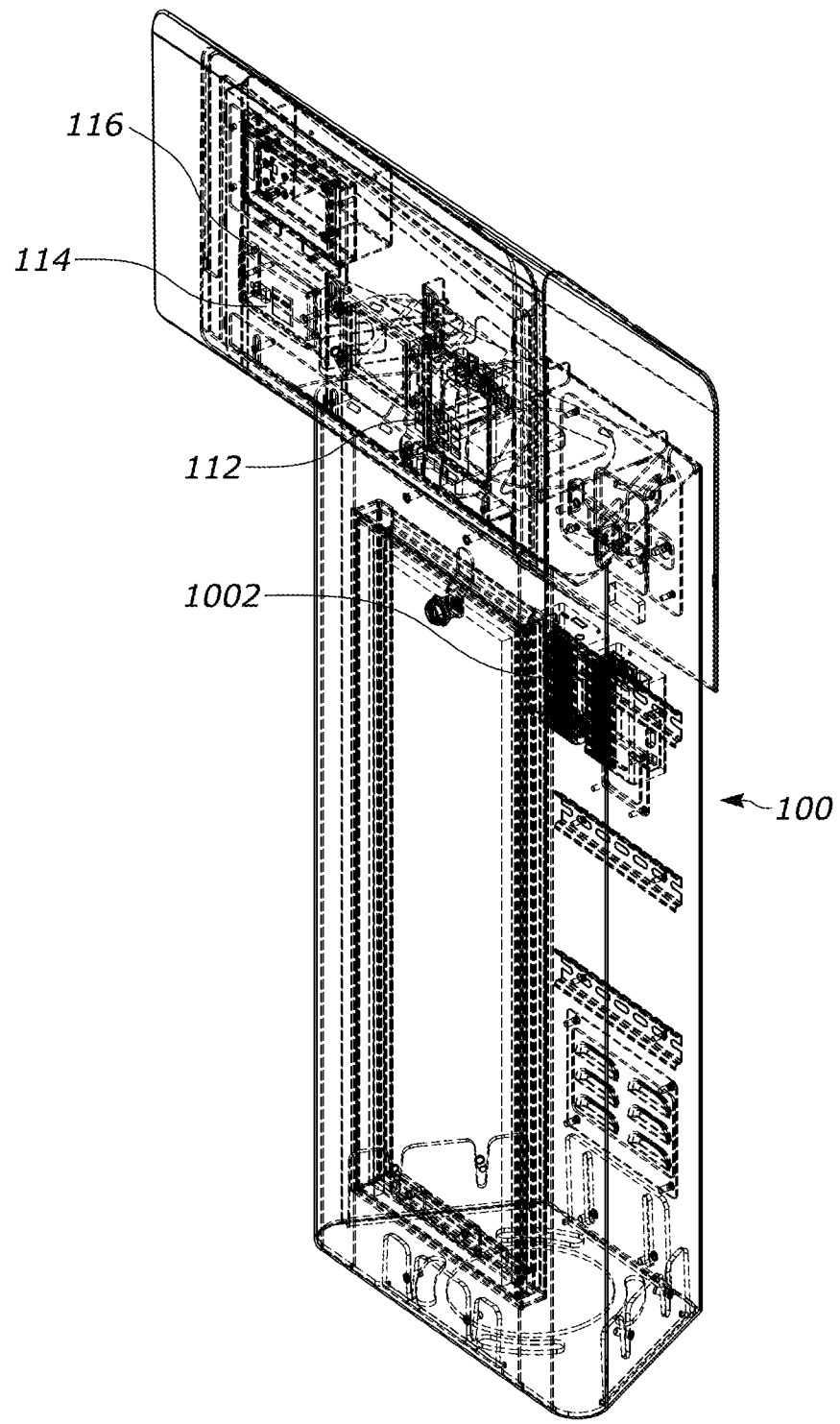

FIG. 10 is a front perspective view of the terminal of FIG. 8 with the covering and other components shown in broken lines to illustrate internal components.

Figure 11:
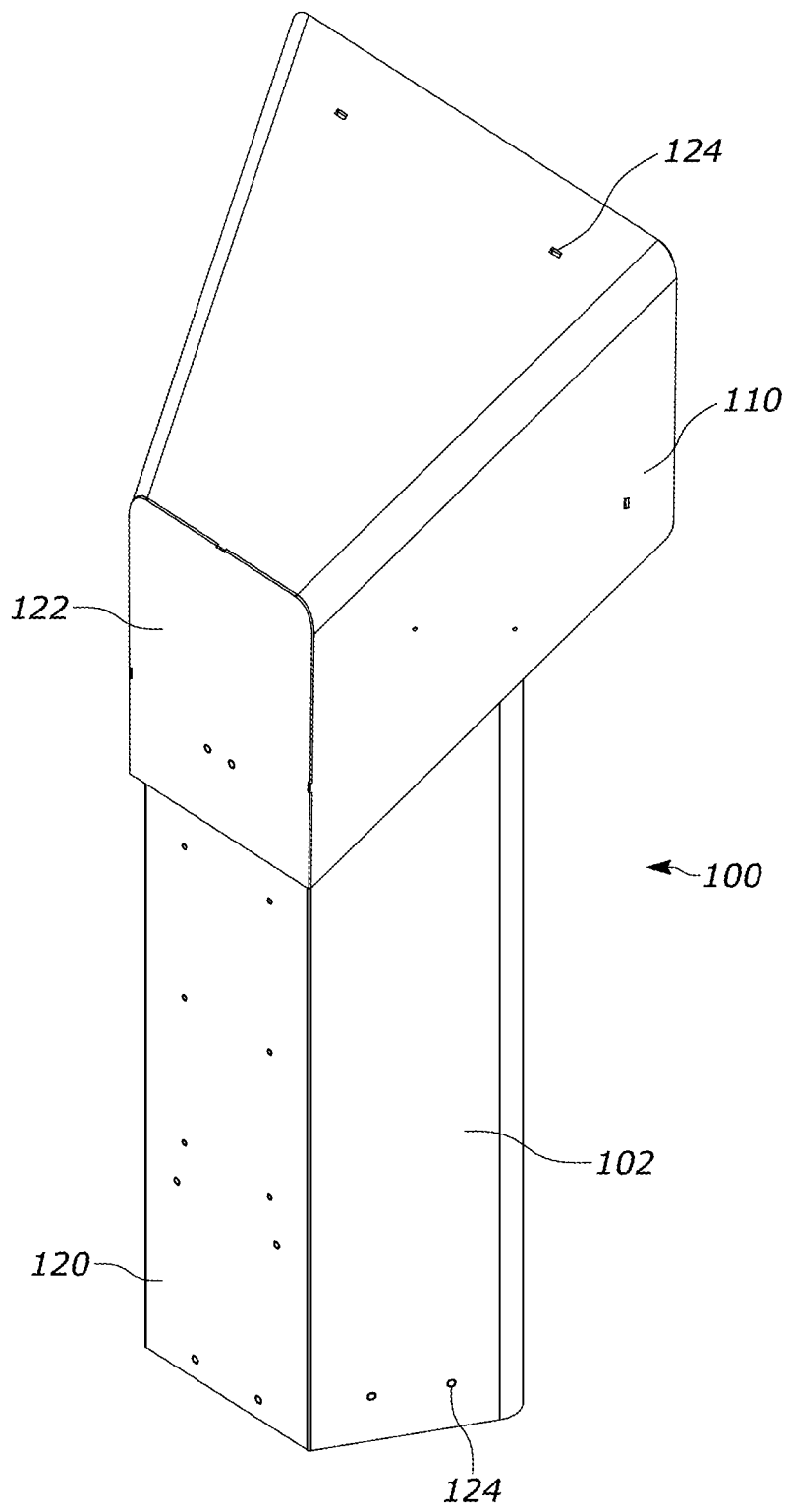

FIG. 11 is a rear perspective view of the terminal of FIG. 8.

Figure 12:
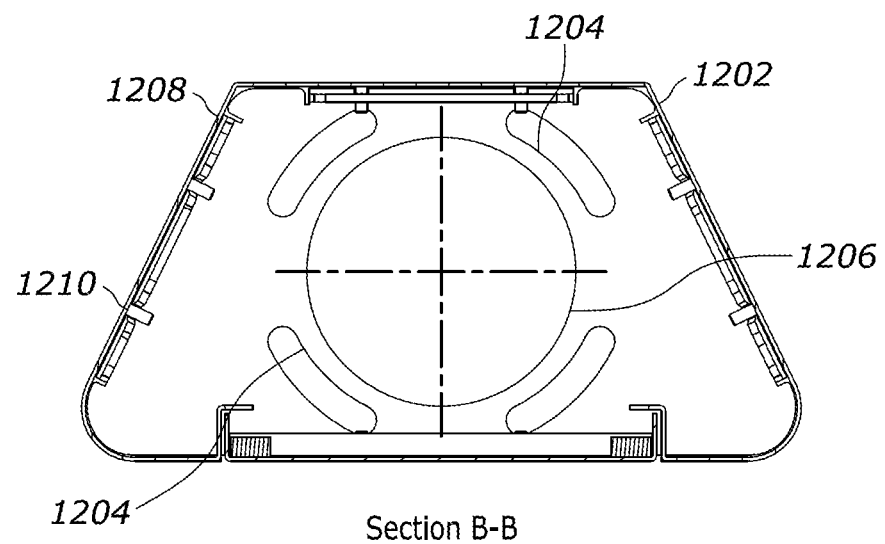

FIG. 12 is a top-down view taken through Section B-B showing the bottom plate of the terminal of FIG. 8.

Figure 13:
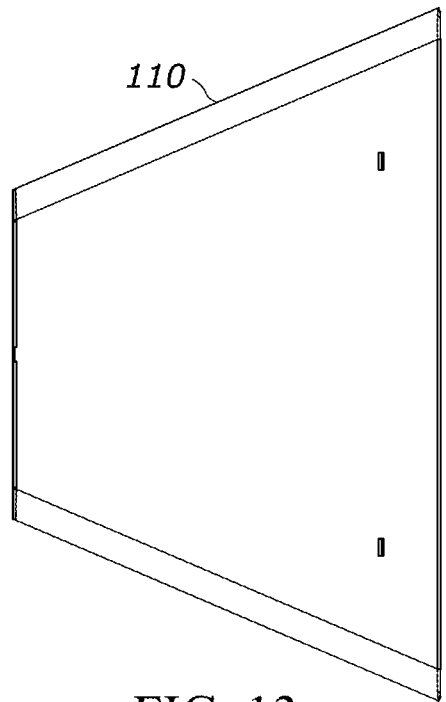

FIG. 13 is a top view of the terminal of FIG. 8.

Figure 14:
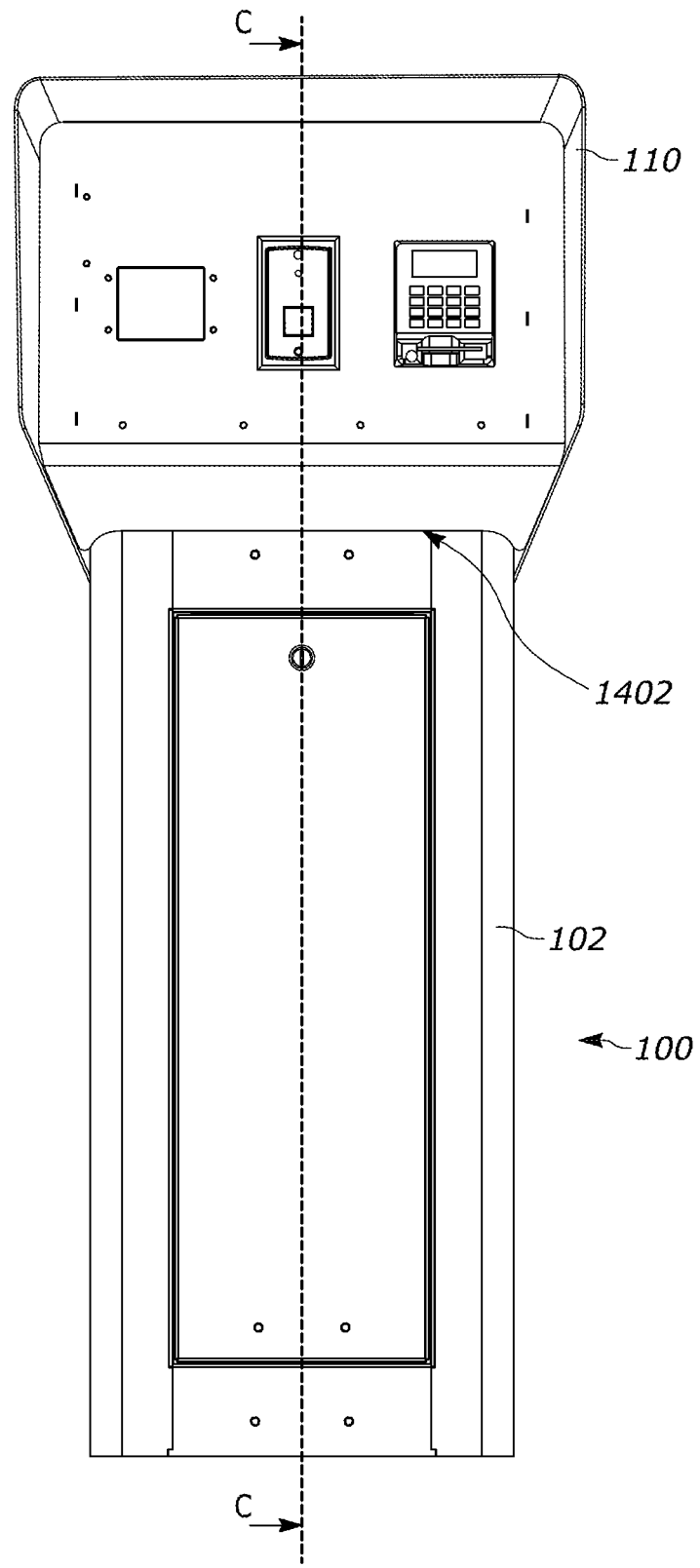

FIG. 14 is a second front view of the terminal of FIG. 8.

Figure 15:
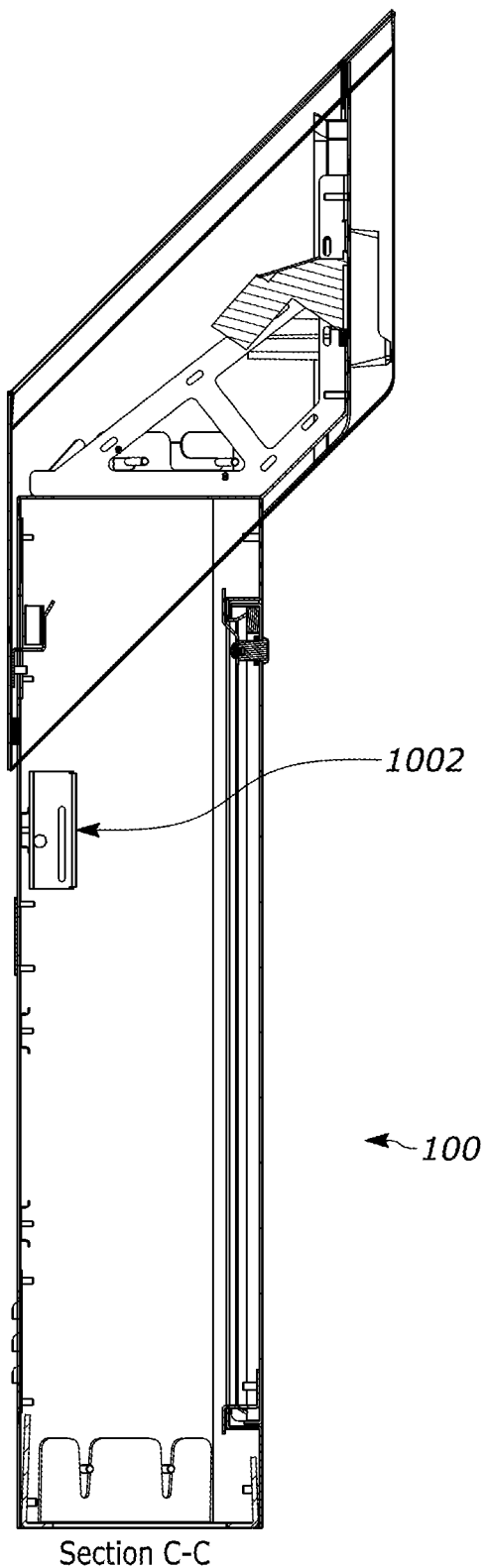

FIG. 15 is a side view taken through Section C-C of the terminal of FIG. 14.

Figure 16:
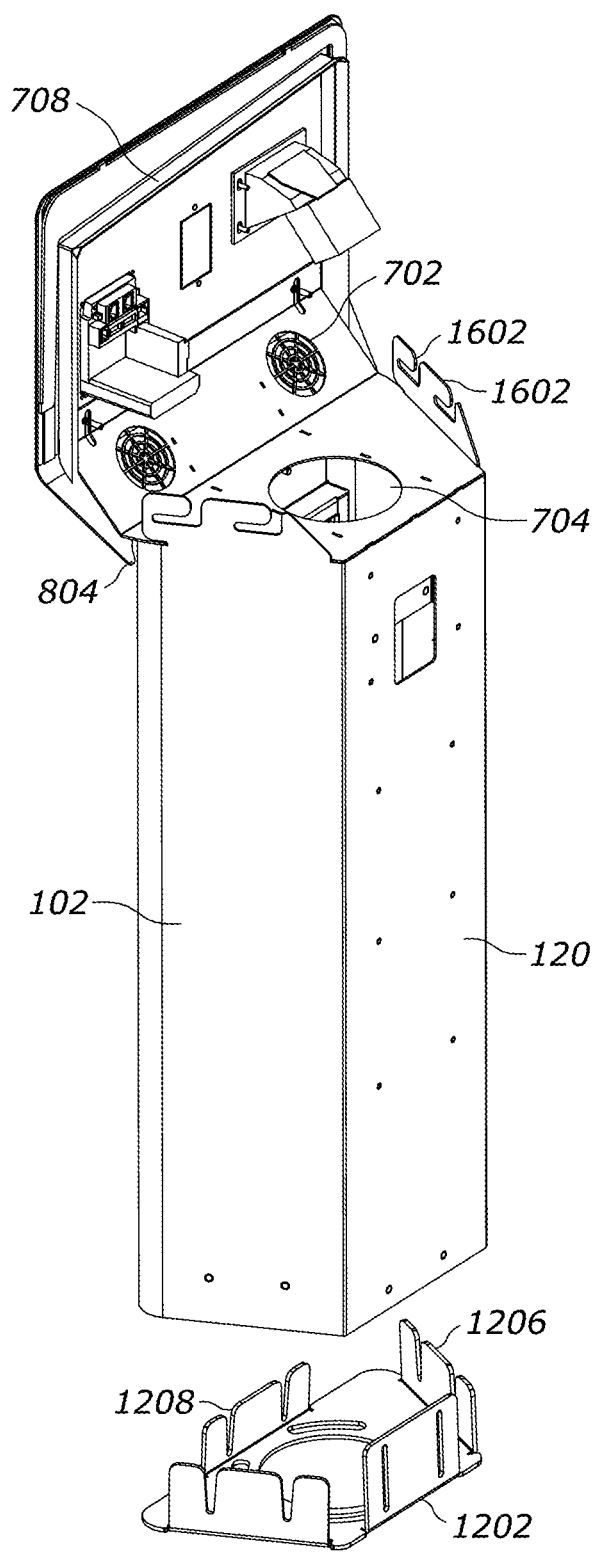

FIG. 16 is a rear perspective view of the terminal of FIG. 8 with the hood removed and the base plate shown separated from the terminal.

Figure 7:
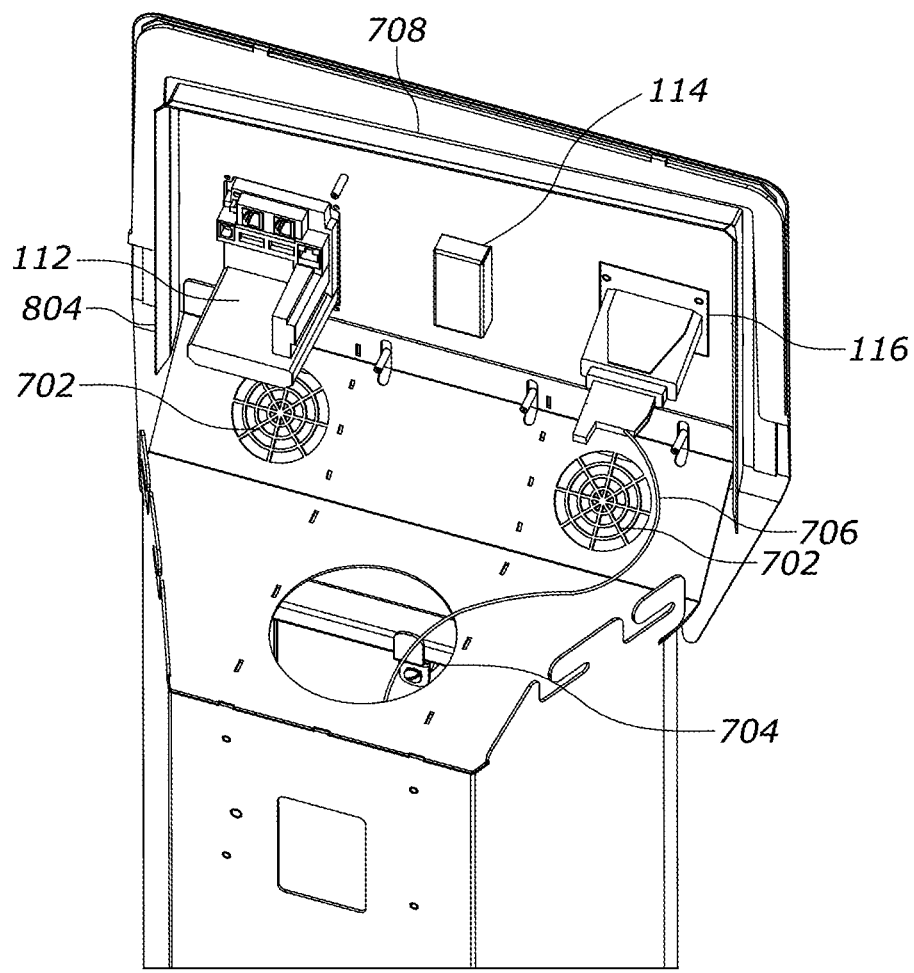
FIG. 7 is a rear view of the terminal of FIG. 7.
Figure 17:
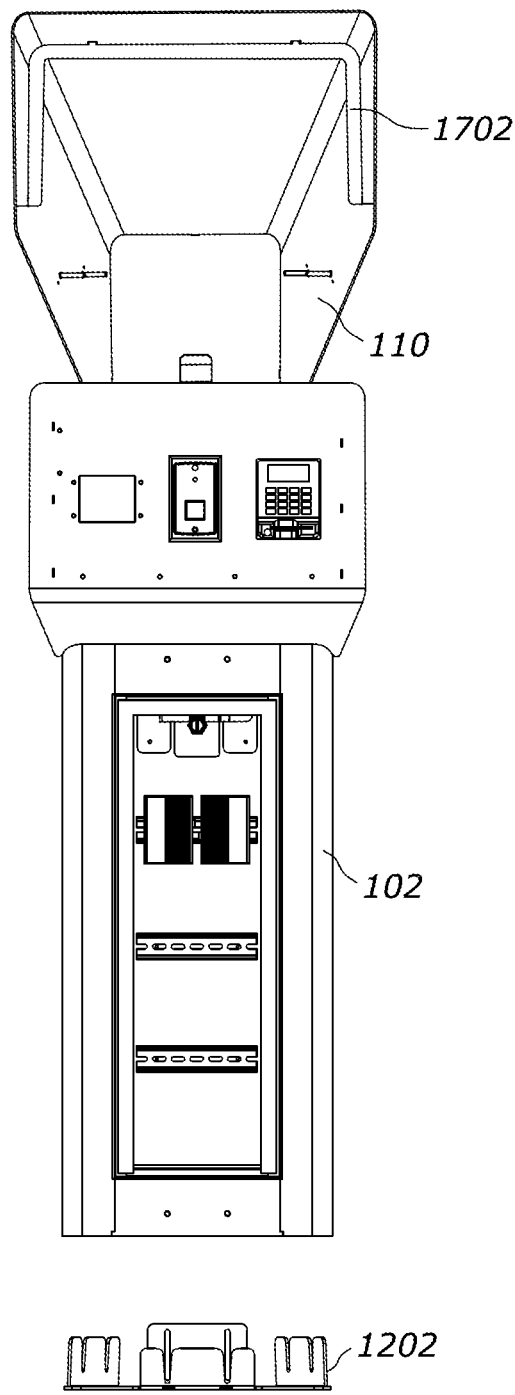

FIG. 17 is an exploded front view of the terminal of FIG. 7 with the access panel omitted.

Figure 18:
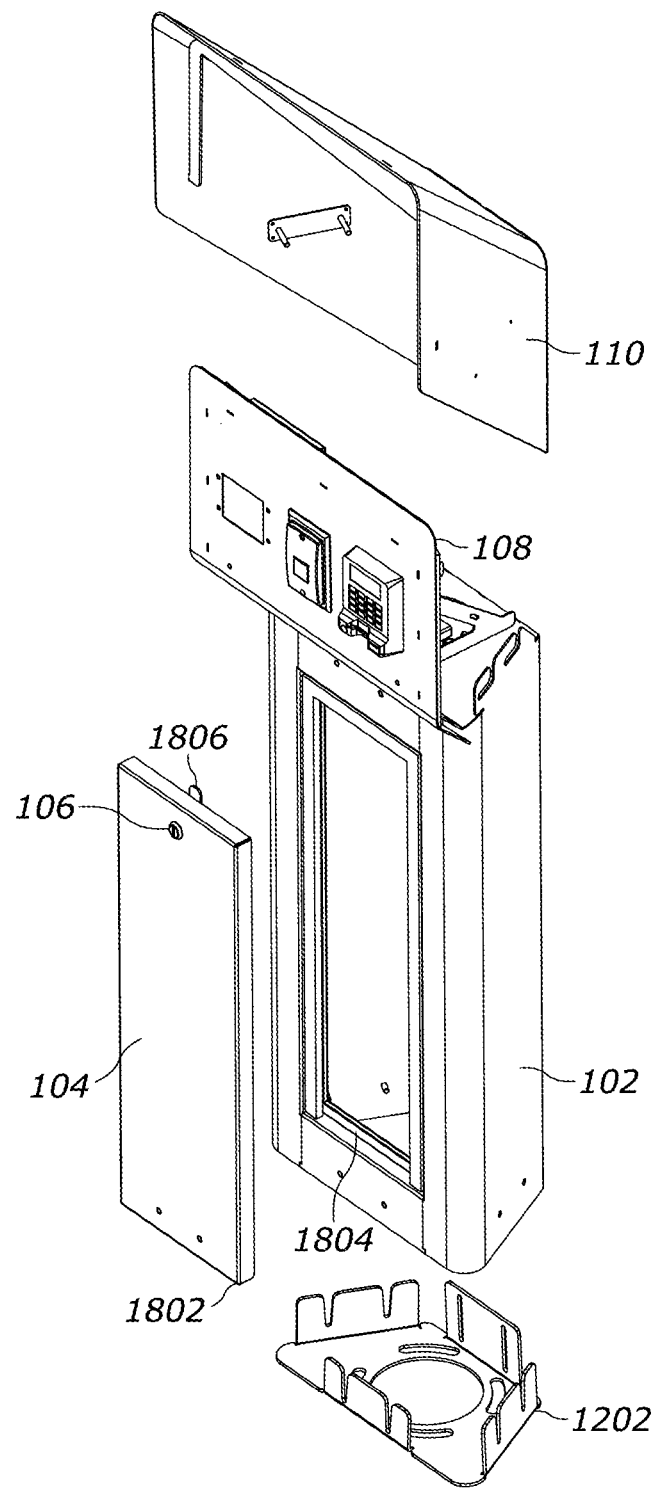

FIG. 18 is an exploded front perspective view of the terminal of FIG. 9.

Figure 19:
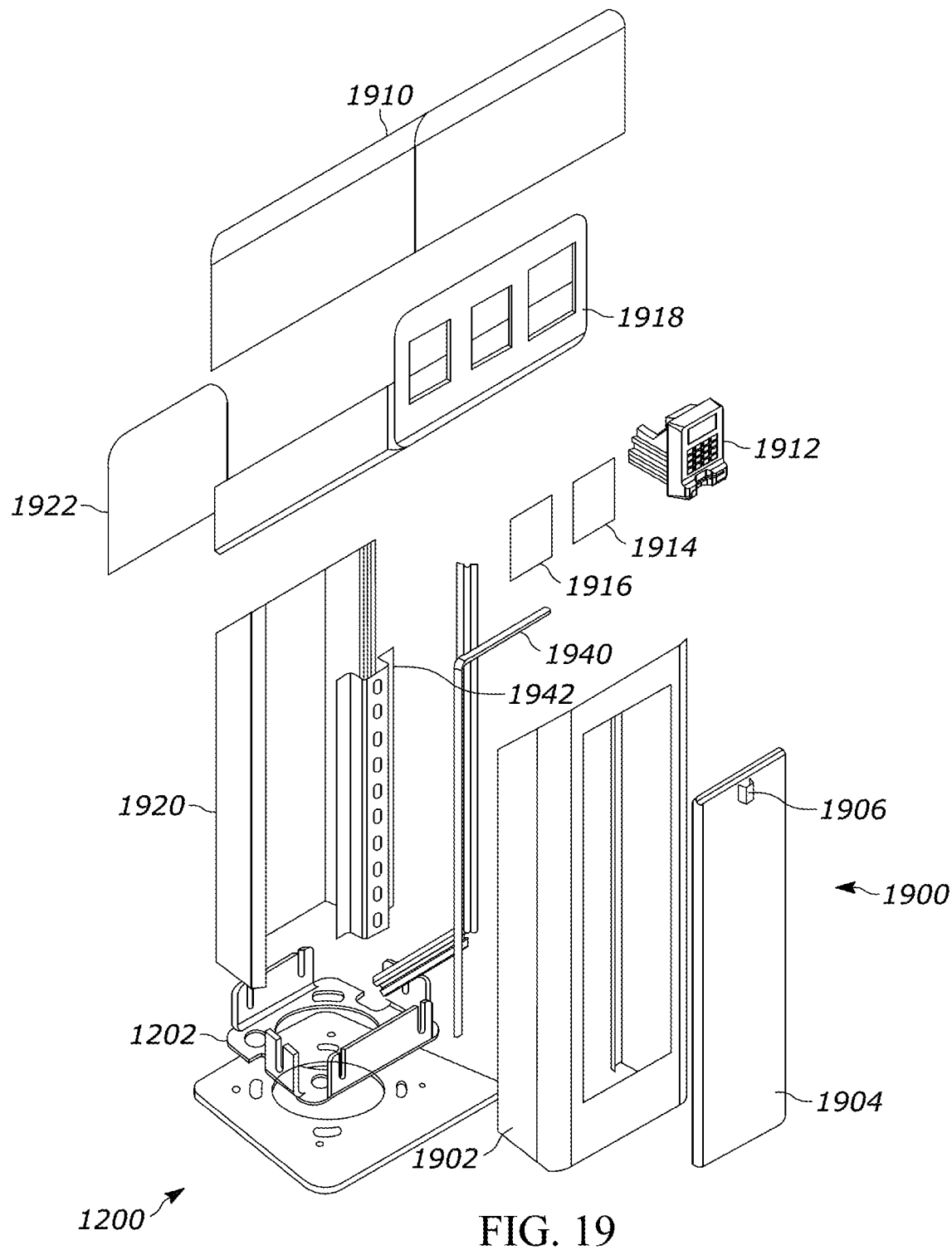

FIG. 19 exemplarily illustrates an exploded view of a fourth embodiment of a terminal.

Figure 20:
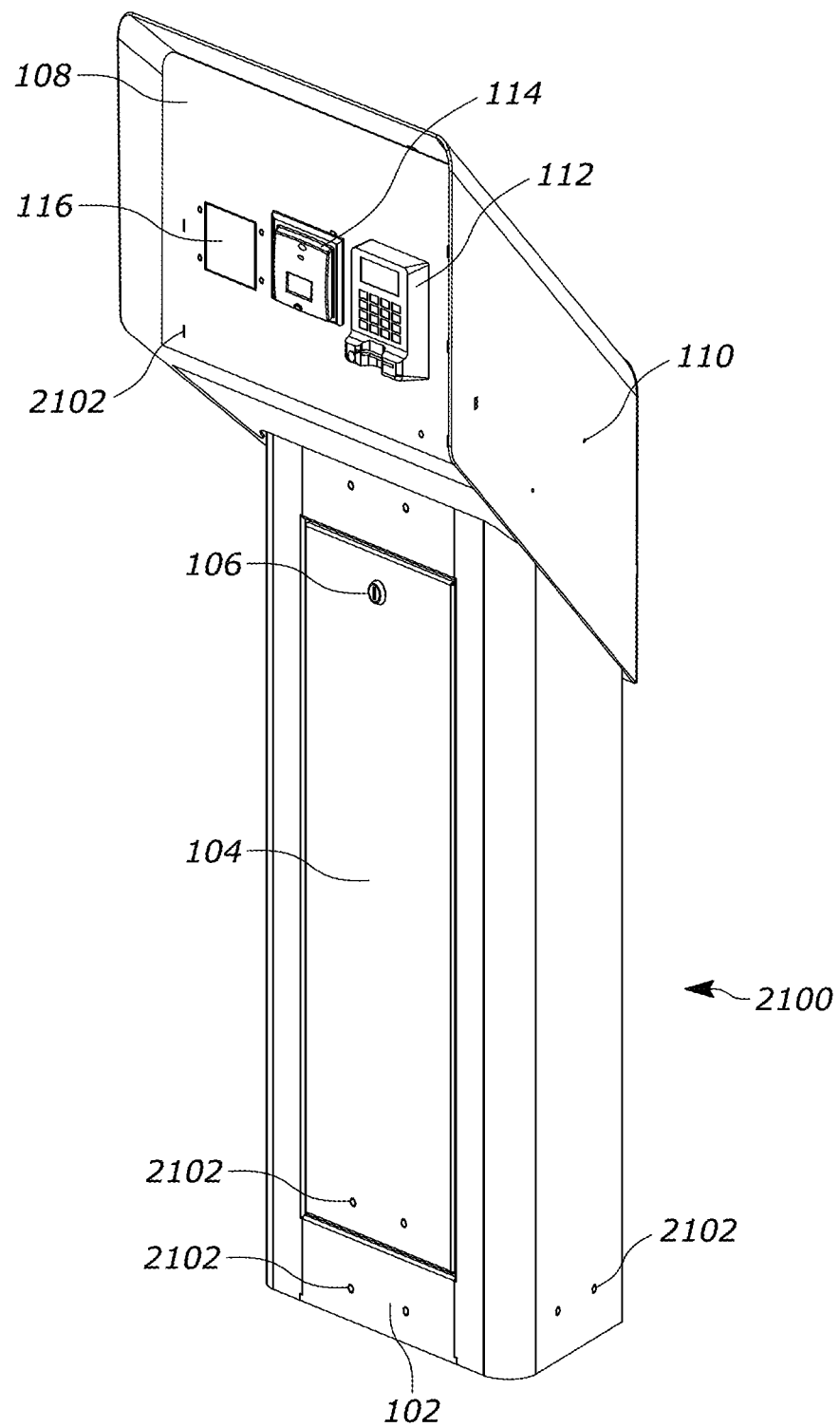

FIG. 20 is a perspective view of a fifth embodiment of a parking terminal.

Figure 21:
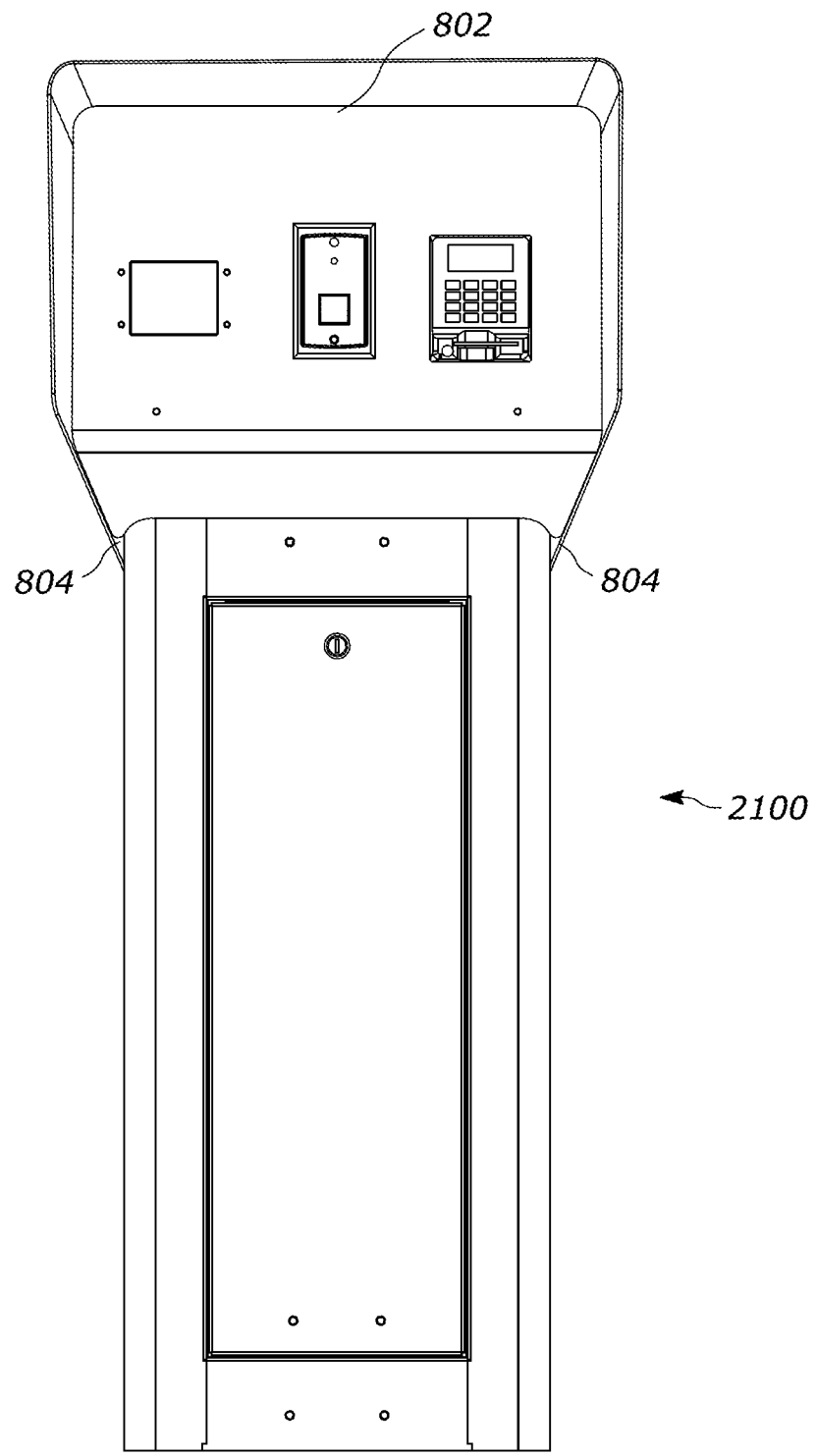

FIG. 21 is a front view of the terminal of FIG. 20.

Figure 22:
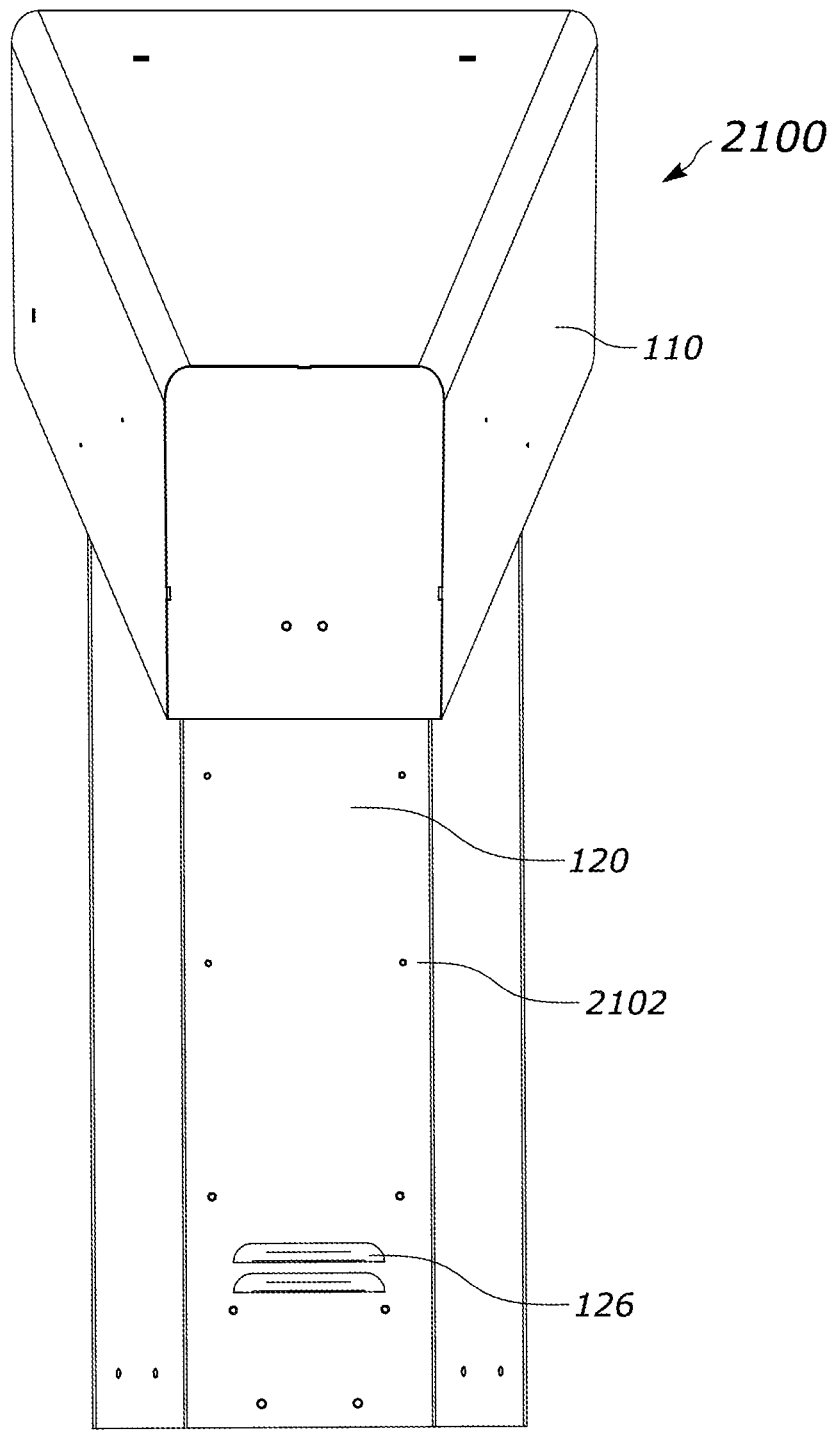

FIG. 22 is a rear view of the terminal of FIG. 20.

Figure 23:
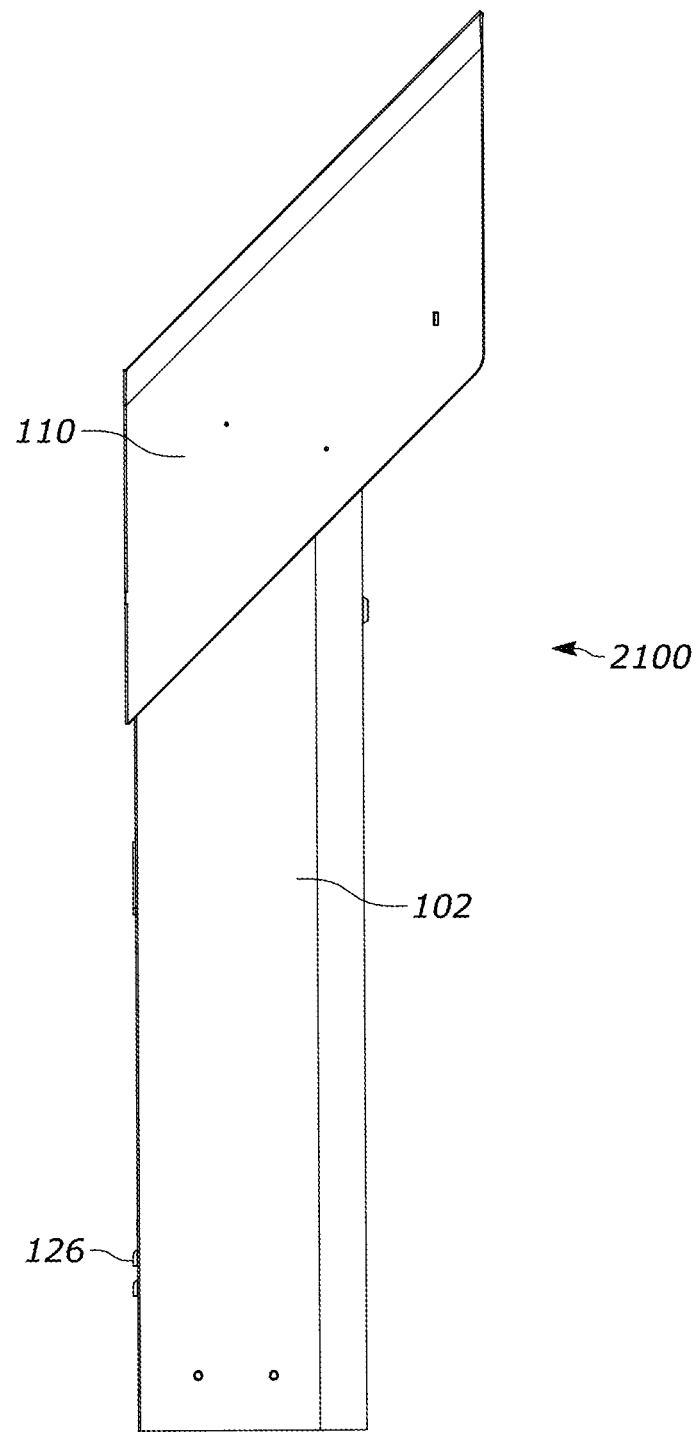

FIG. 23 is a right side view of the terminal of FIG. 20.

Figure 24:
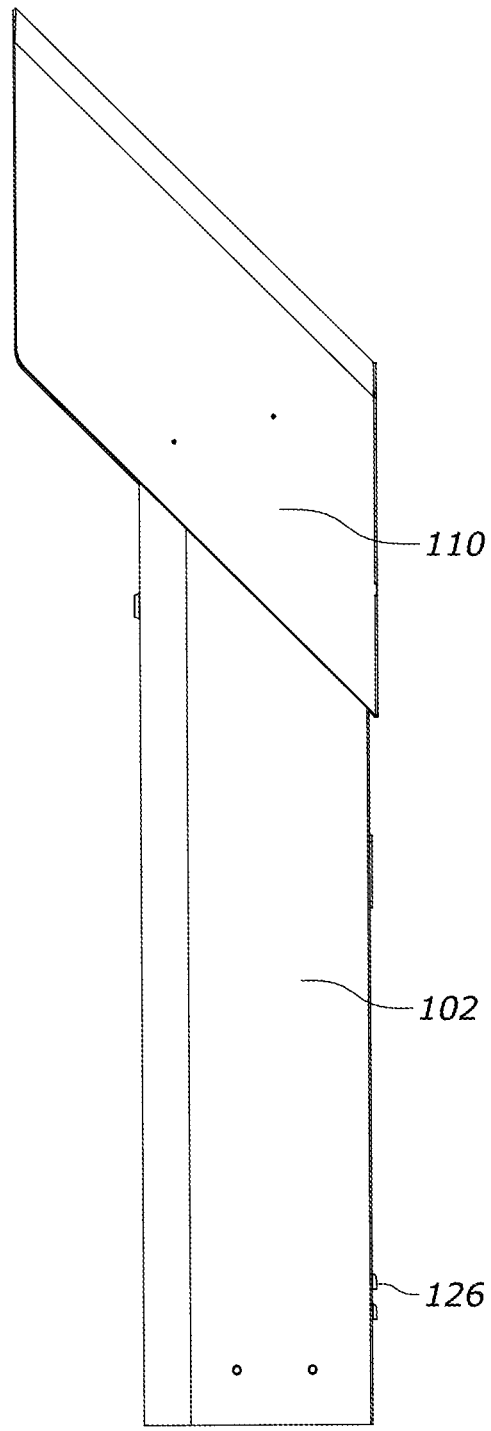

FIG. 24 is a left side view of the terminal of FIG. 20.

Figure 25:
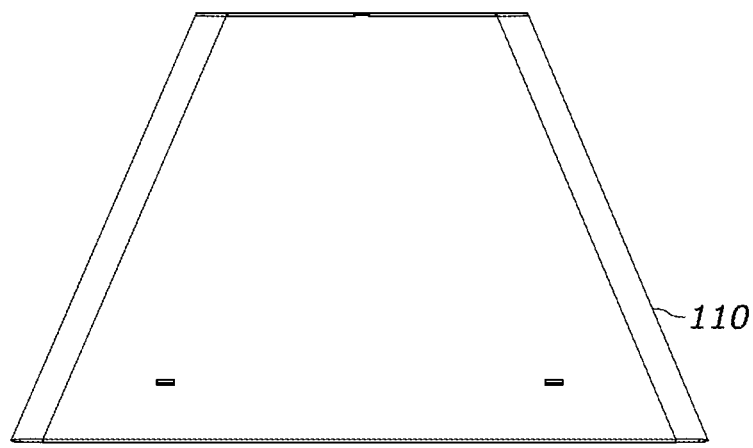

FIG. 25 is a top view of the terminal of FIG. 20.

Figure 26:
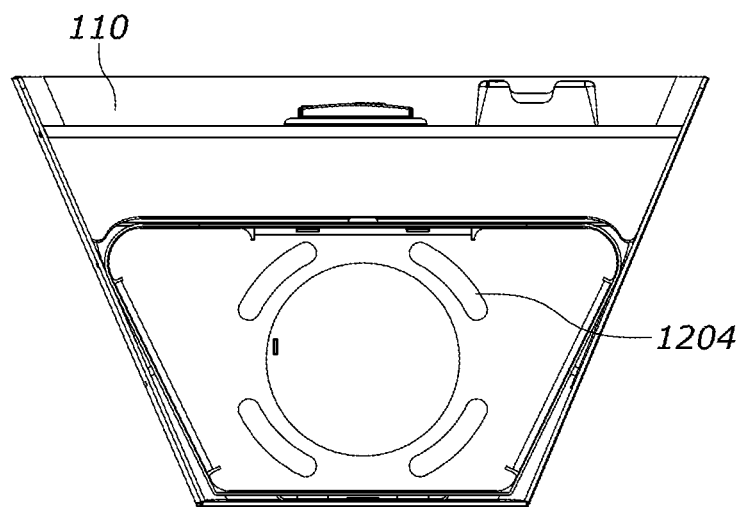

FIG. 26 is a bottom view of the terminal of FIG. 20.

Figure 27:
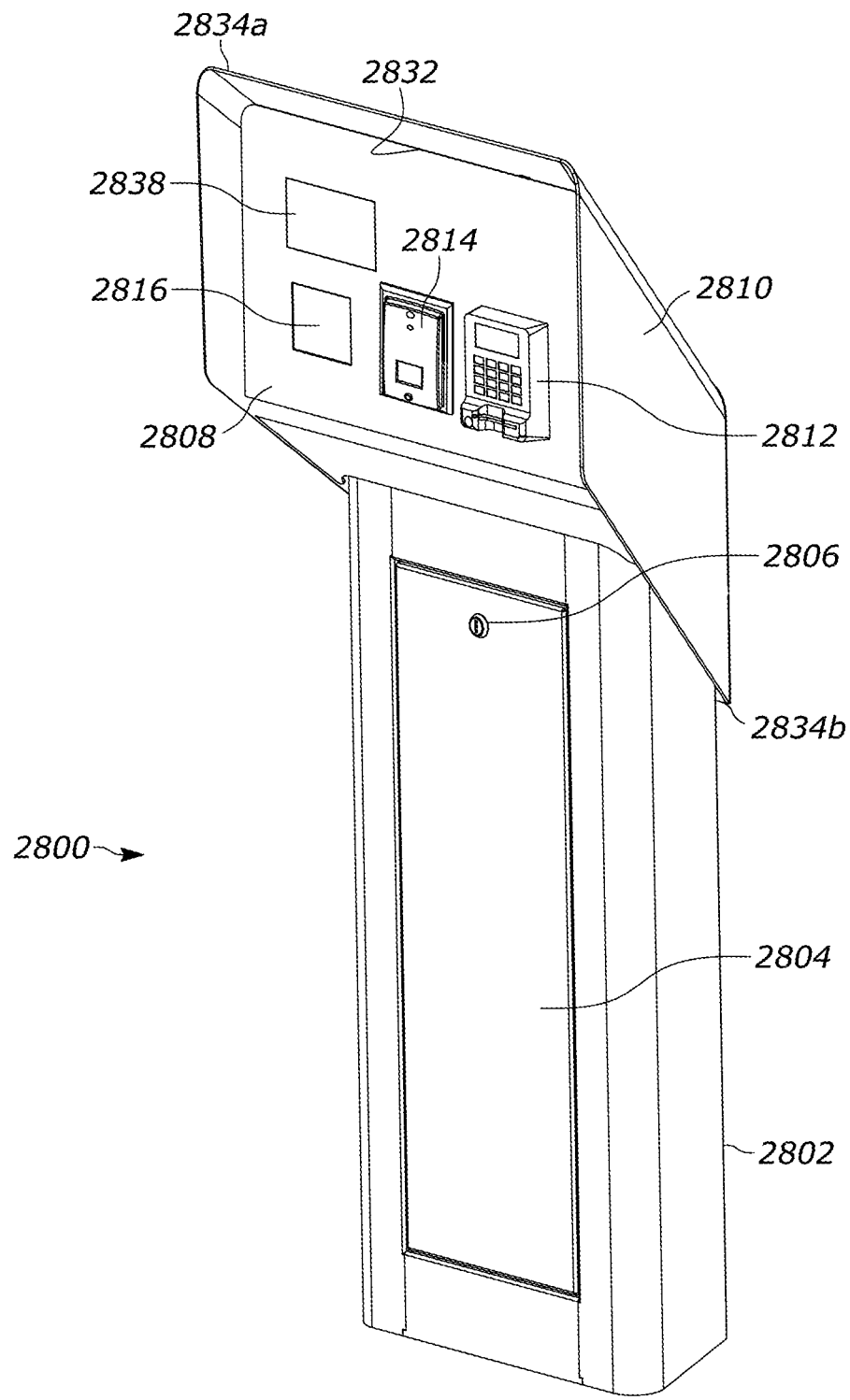

FIG. 27 is a perspective view of a sixth embodiment of a parking terminal.

Figure 28:
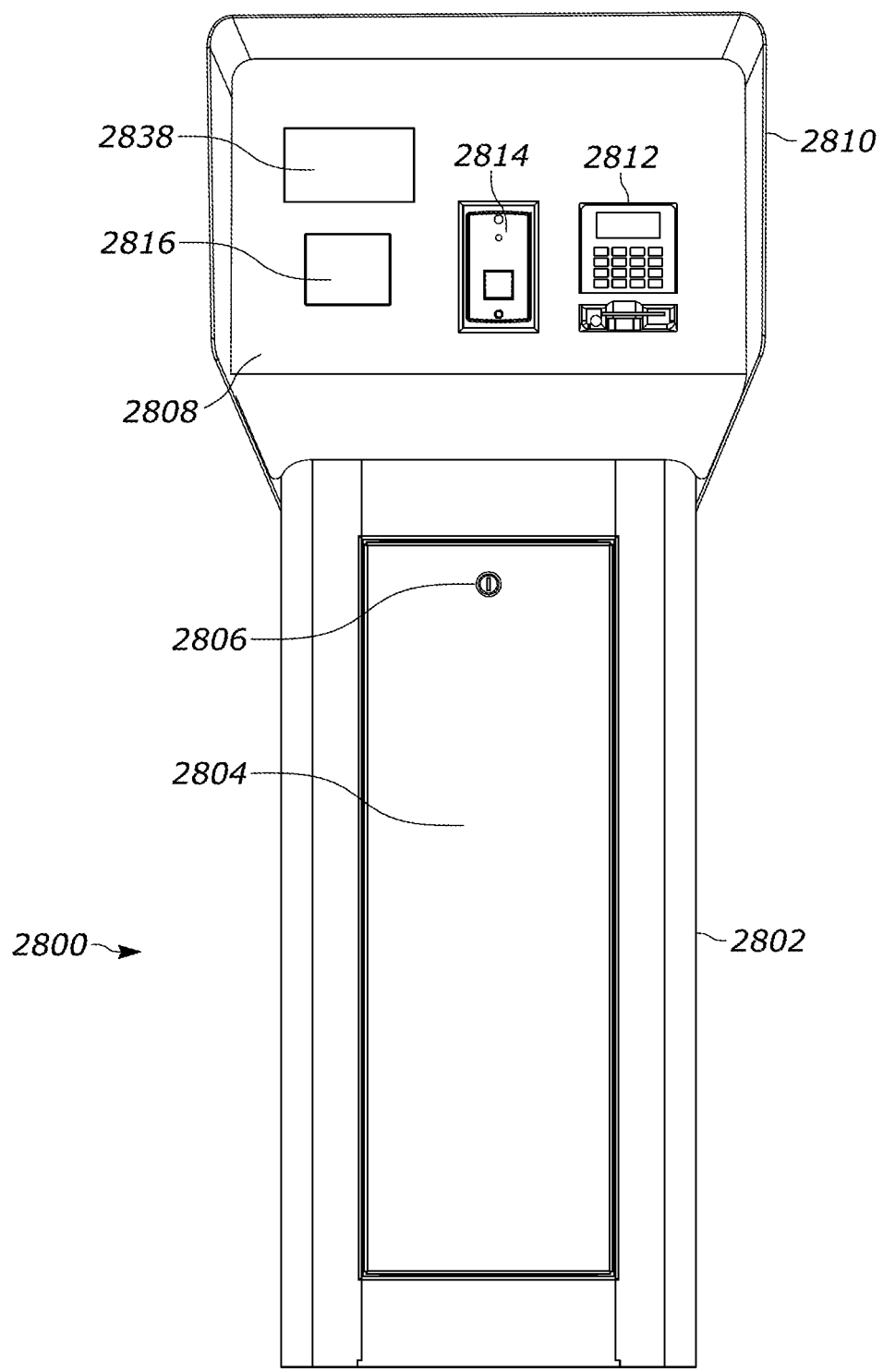

FIG. 28 is a front view of the parking terminal of FIG. 27.

Figure 29:
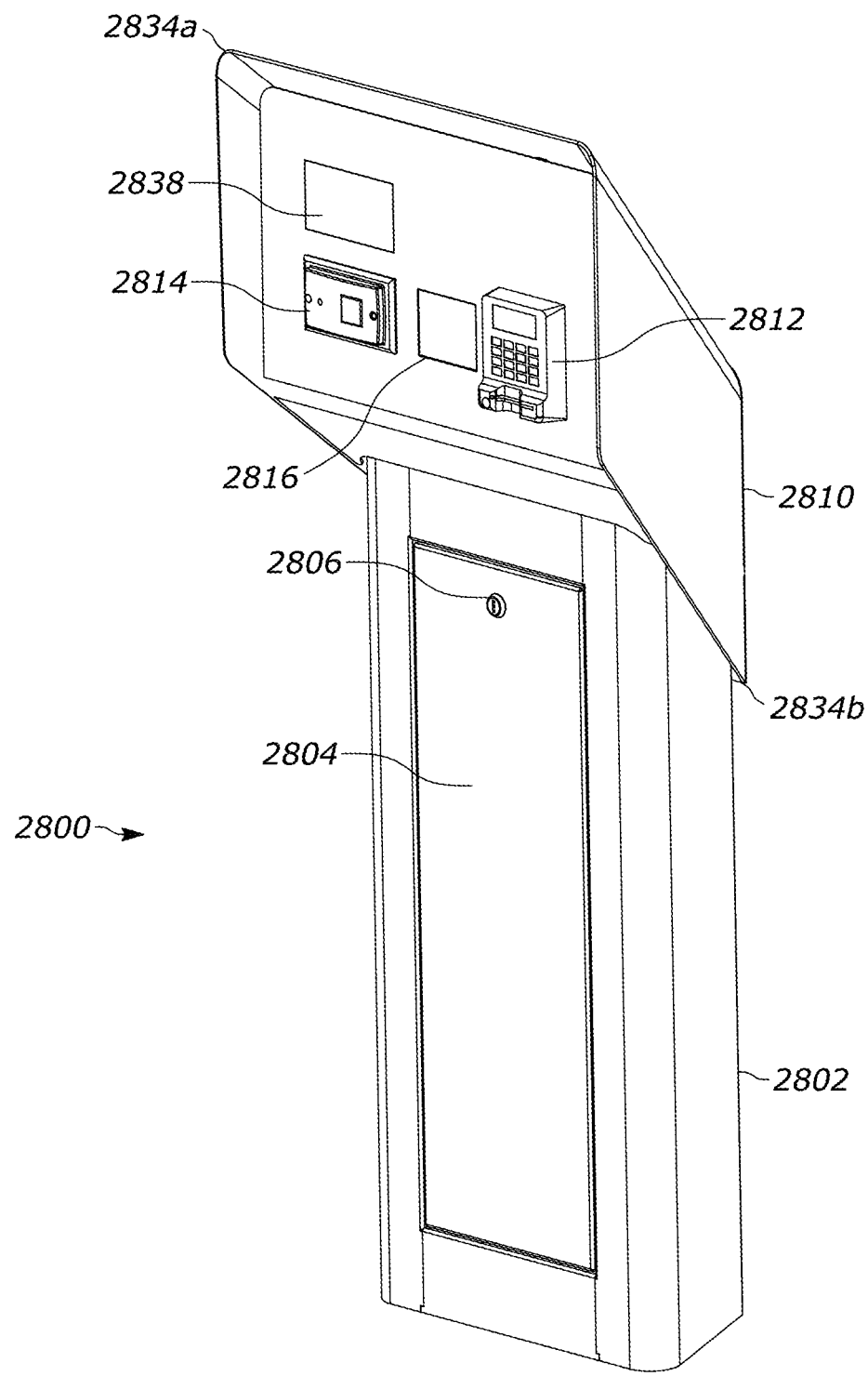

FIG. 29 is a second perspective view of the sixth embodiment of a parking terminal with the devices rearranged on the inner panel.

Figure 30:
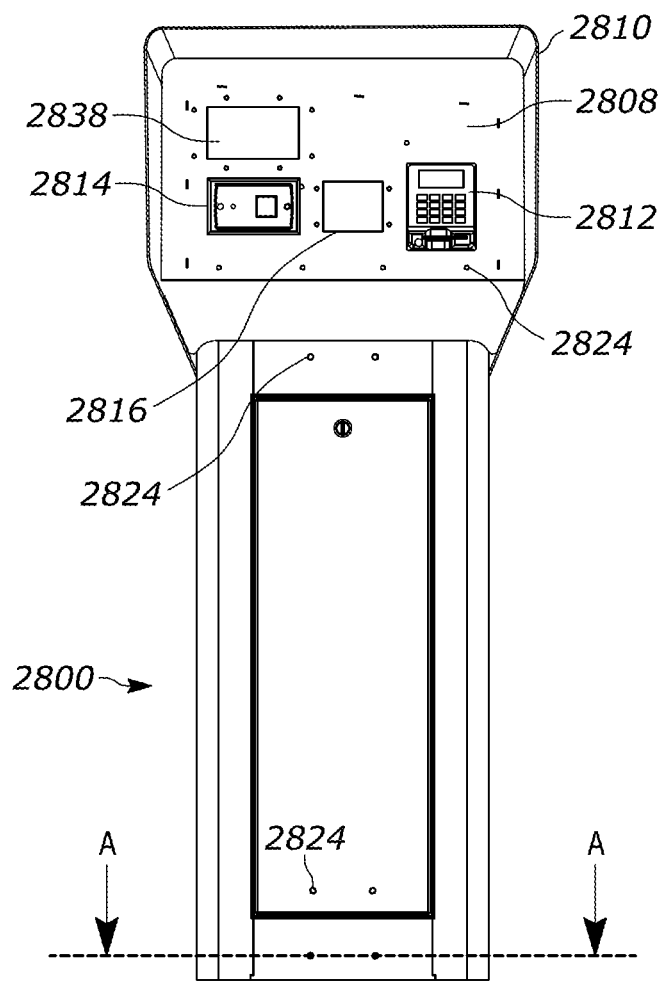

FIG. 30 is a front view of the parking terminal of FIG. 29.

Figure 31:
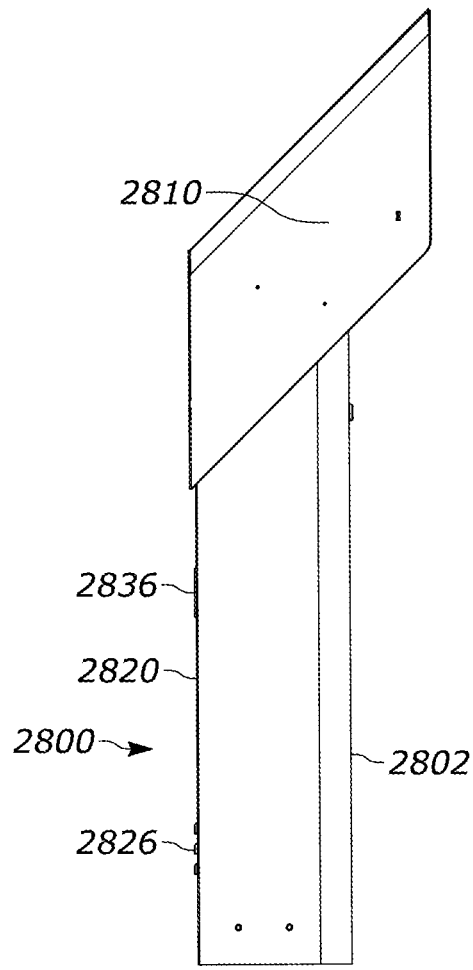

FIG. 31 is a side view of the parking terminal of FIG. 29.

Figure 32:
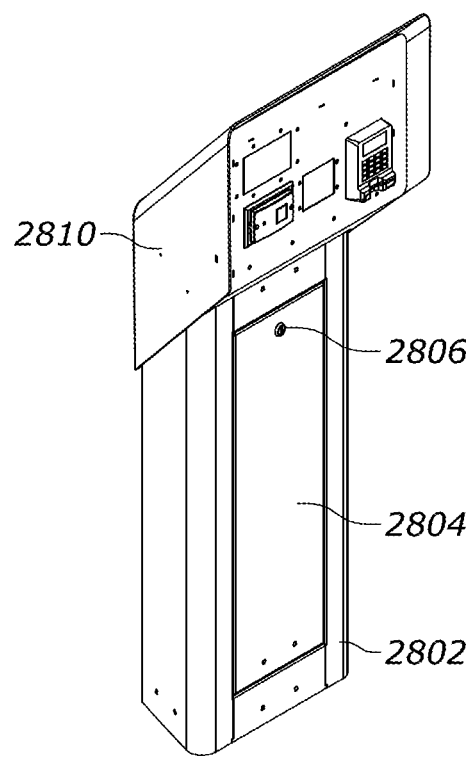

FIG. 32 is a front perspective view of the parking terminal of FIG. 29.

Figure 33:
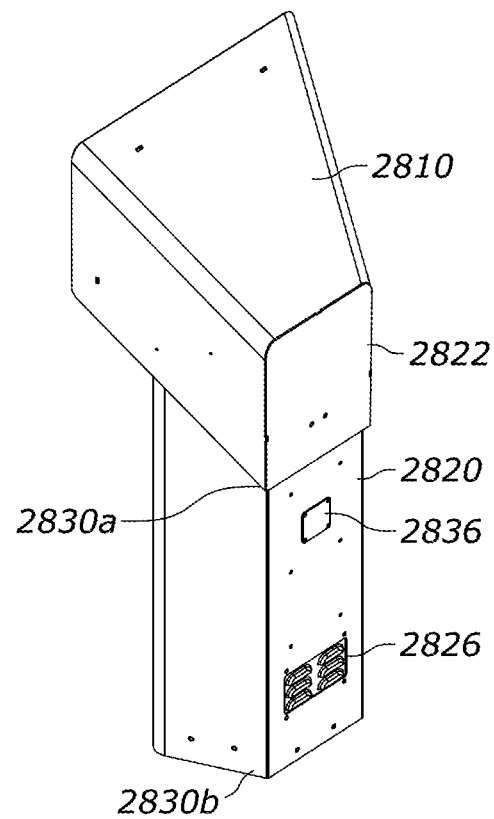

FIG. 33 is a rear perspective view of the parking terminal of FIG. 29.

Figure 34:
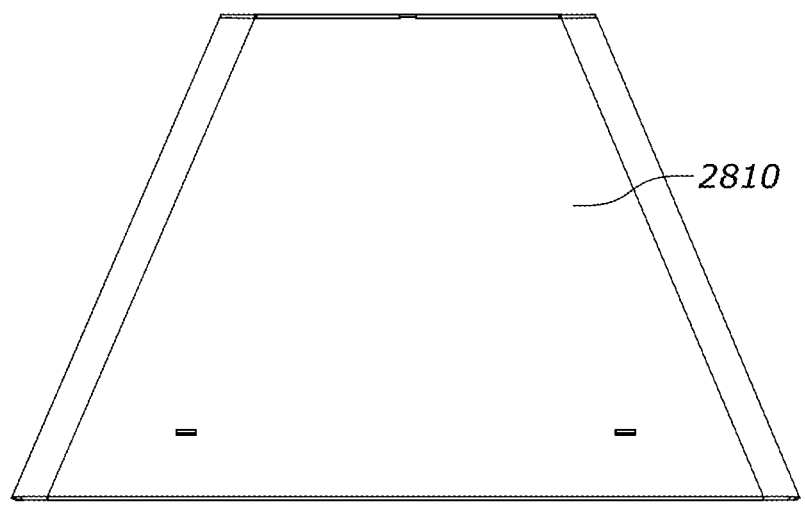

FIG. 34 is a top view of the parking terminal of FIG. 29.

Figure 35:
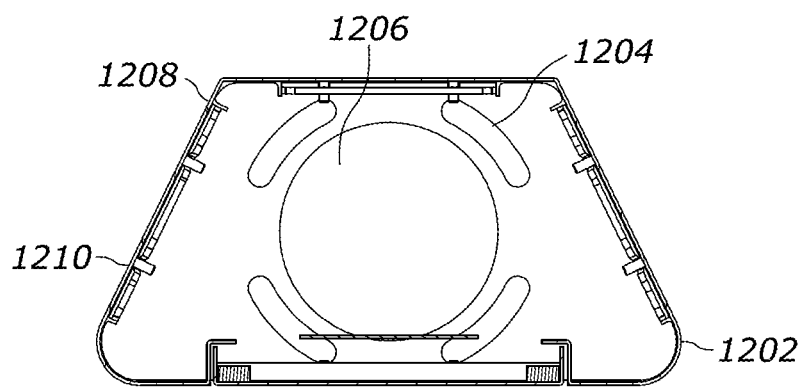

FIG. 35 is a bottom view of the parking terminal of FIG. 29.

Figure 36:
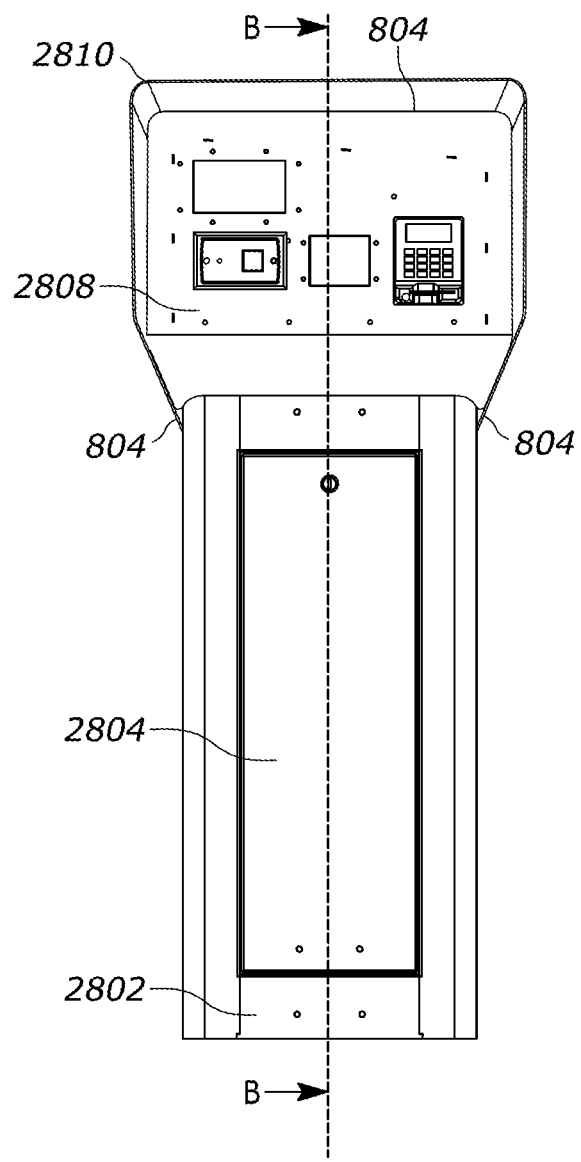

FIG. 36 is a second front view of the parking terminal of FIG. 29.

Figure 37:
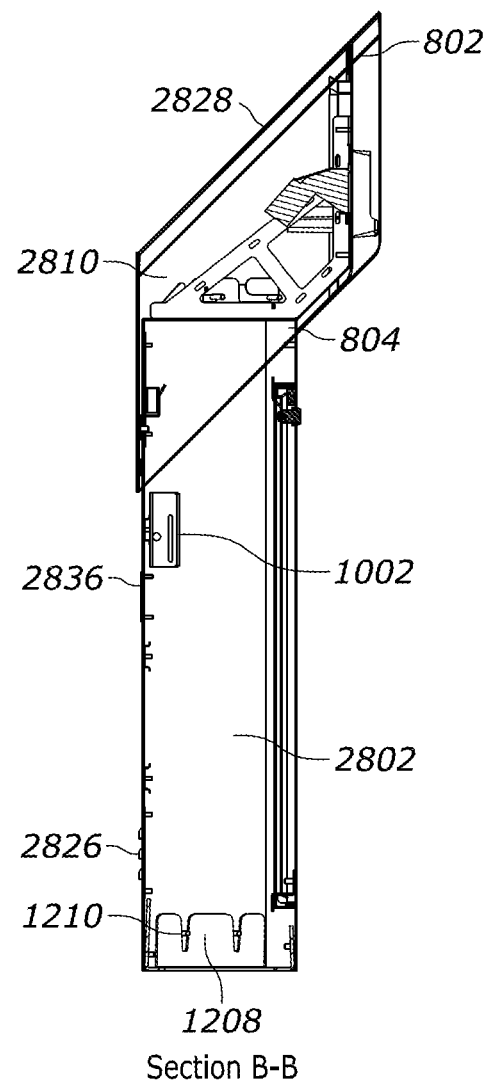

FIG. 37 is a cutaway side view of the parking terminal of FIG. 29.

Figures 38, 39:
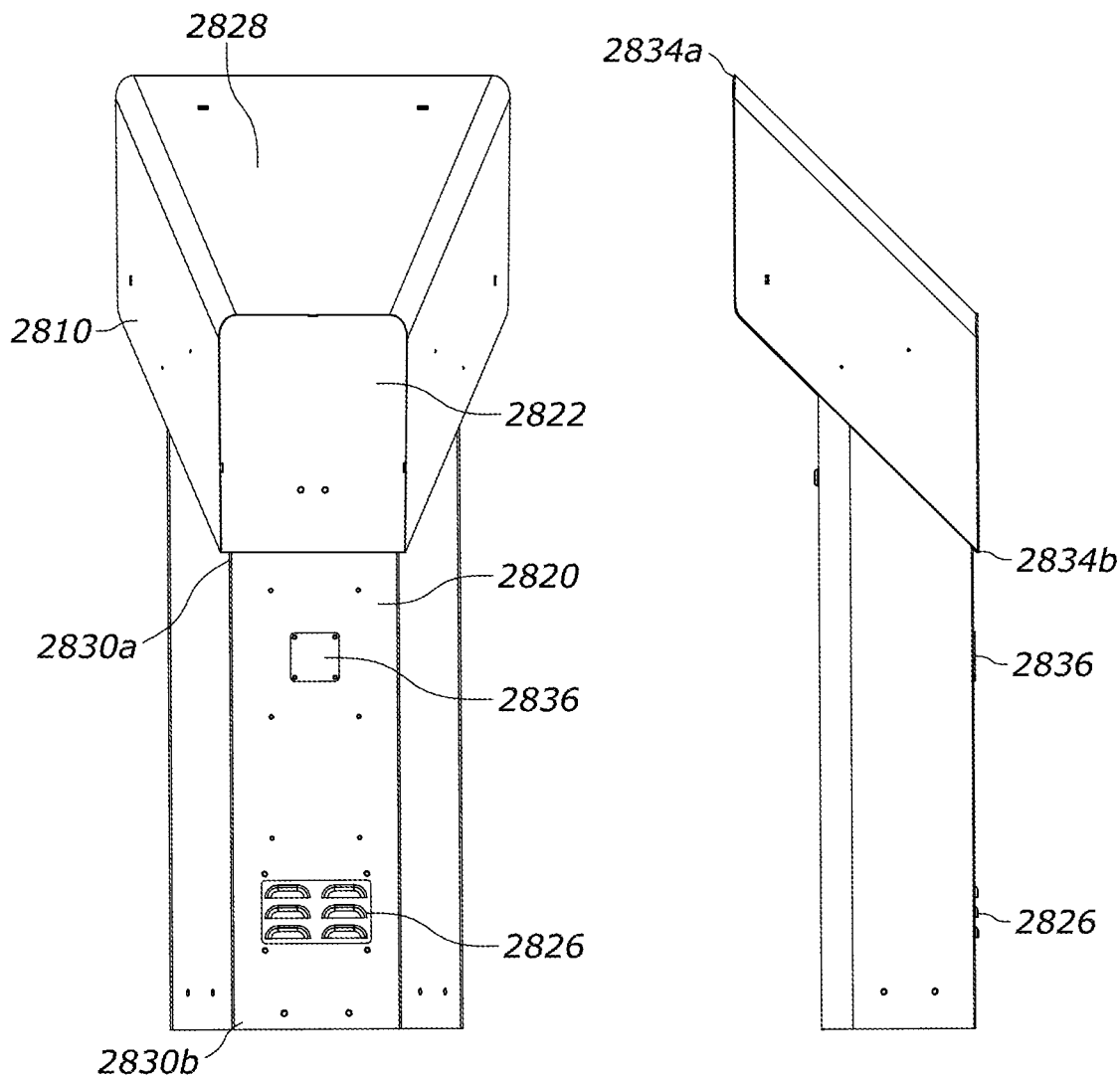

FIG. 38 is a rear view of the parking terminal of FIG. 29.

FIG. 39 is a second side view of the parking terminal of FIG. 29.

Figure 40:
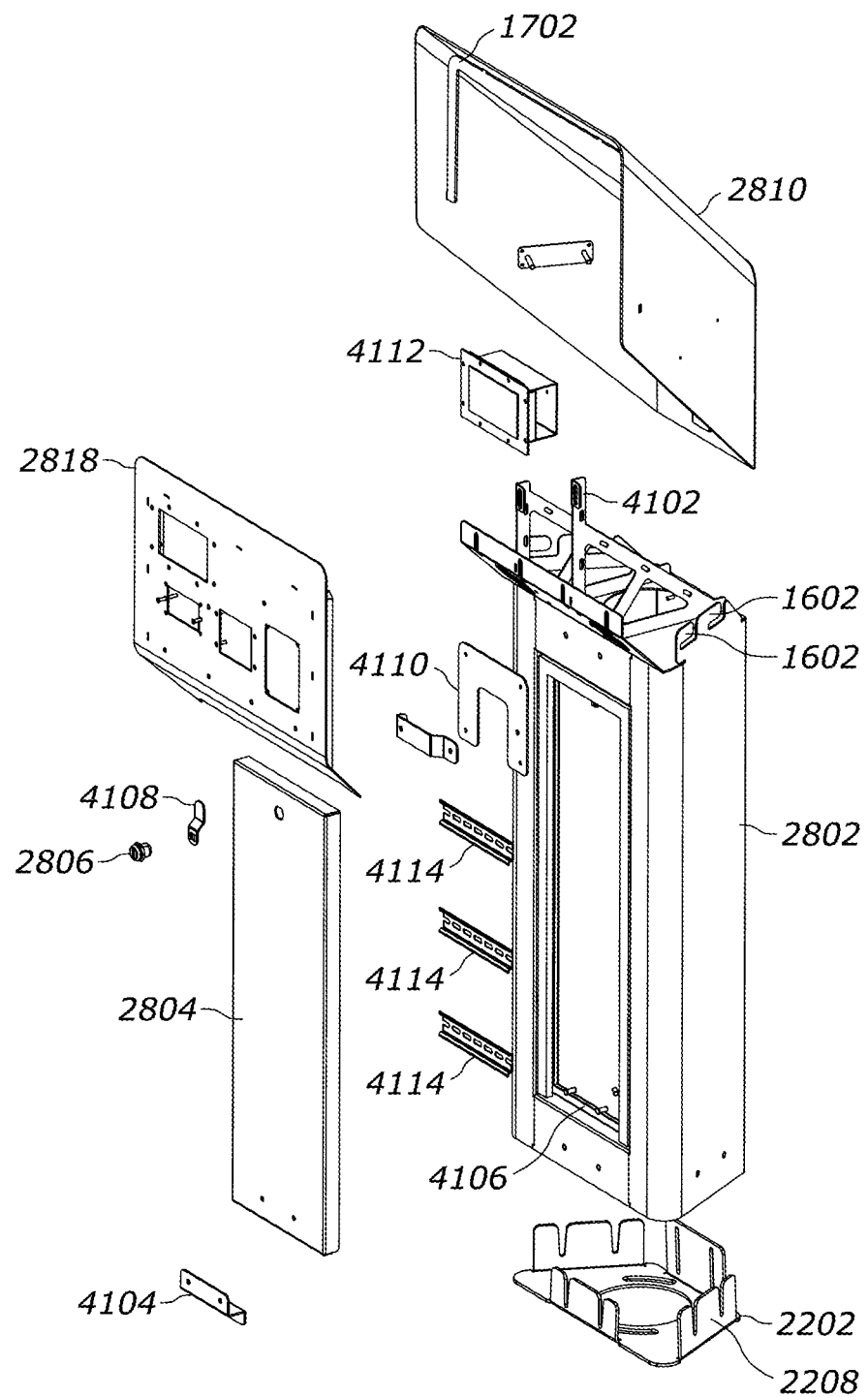

FIG. 40 is an exploded view of the parking terminal of FIG. 29.

Figure 41:
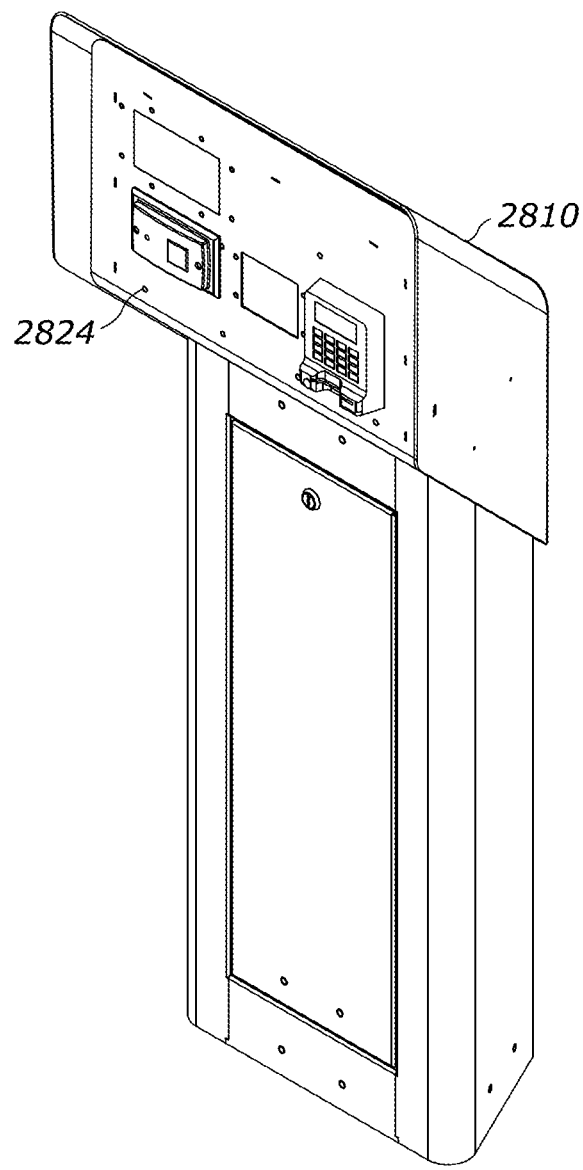

FIG. 41 is a third perspective view of the parking terminal of FIG. 29.

Figure 42:
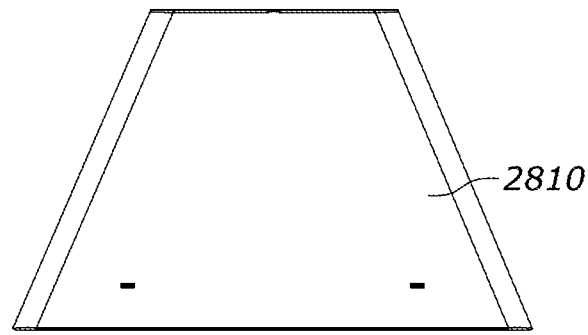

FIG. 42 is an additional top view of the parking terminal of FIG. 29.

Figure 43:
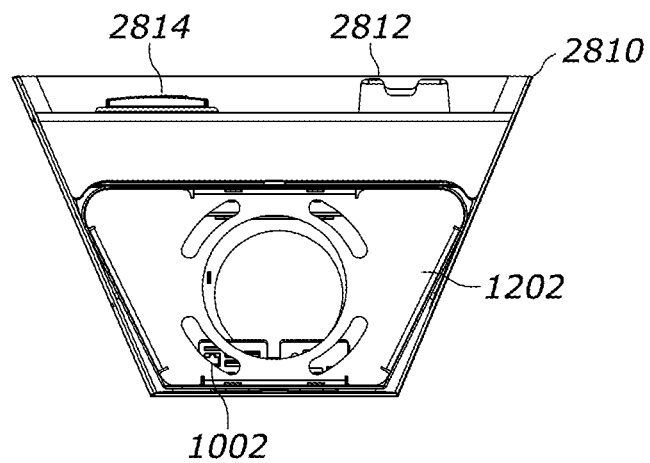

FIG. 43 is an alternative bottom view of the parking terminal of FIG. 29.

DETAILED DESCRIPTION OF THE DISCLOSURE

The following disclosure as a whole may be best understood by reference to the provided detailed description when read in conjunction with the accompanying drawings, drawing description, abstract, background, field of the disclosure, and associated headings. Identical reference numerals when found on different figures identify the same elements or a functionally equivalent element. The elements listed in the abstract are not referenced but nevertheless refer by association to the elements of the detailed description and associated disclosure.

Express Terminal

As shown in FIGS. 1 through 43, embodiments of the present disclosure provide a terminal 100, 1900, 2100, and 2800 (also referred to herein as an Express Terminal or ET) for use in controlling access to an area. In embodiments, the terminal manages access to a parking facility. The terminal 100 generally acts cooperatively with an access control mechanism—such as a gate, door, or other physical barrier that physically impedes access to a facility or a virtual access control or other barrier or enforcement mechanism such as License Plate Recognition, License Plate Enforcement, or another enforcement such as towing of unauthorized vehicles—to ensure that only authorized users are permitted vehicular access to the facility, only authorized users (i.e., users who have paid) are permitted to depart a facility, and/or that unauthorized vehicles within a facility are identified so that remedial and/or enforcement action may be taken. The parking facility may be, by way of example, a parking garage, surface lot, or other restricted area into which only authorized vehicles are permitted access. In embodiments, the terminal 100 is located proximate an access control mechanism at the entrance and/or exit to a facility. In embodiments, the terminal 100 is connected to a broader access control system (as discussed in greater detail below) and serves as a physical interaction point for a user desiring to enter or leave the parking facility. In other embodiments, the terminal functions as a stand-alone device that works directly with the access control mechanism and a payment processor to control access to the parking facility.

As shown, in embodiments, the terminal 100 comprises a front plate 102, access panel 104, hood 110, inner panel 108, back plate 120, and upper back plate 122 that cooperatively form the exterior surface of the terminal 100. As will be clear to one of skill in the art, in embodiments, the foregoing components may each comprise multiple elements or may be combined into single physical structures. By way of example, in an embodiment, the front plate 102 comprises multiple plates that are separately formed before being jointed together while the back plate 120 and upper back plate 122 comprises a single unitary structure formed as a single piece. Other alternative arrangements will be clear to one of skill in the art from the present disclosure.

One or more devices may be disposed along inner panel 108. In the embodiment shown in FIG. 1, a scanner/reader 116 for reading the barcode of a card, paper, or mobile device; an RFID reader 114 for optically reading a radio-frequency ID (RFID) and or near field communication (NFC); credit card reader 112, and PIND pad 112 are each disposed on the inner panel 108. As will be clear to one of skill in the art, other arrangements and/or combinations of devices may also or instead be disposed on the inner panel 108. Each of the devices 112, 114, and 116 is coupled to a controller 1002 and power supply (not shown), which may be provided through electrical mains and/or a battery, such as through wiring 706. A central channel 704 in the terminal 100 permits the routing of cabling 706 between components as well as the flow of air through the terminal 100 (as discussed in greater detail below). In embodiments, one or more speakers 702 and/or one or more microphones (not shown) are also disposed on the inner panel 108. In embodiments, channels 1602 are configured to receive corresponding protrusions on the hood 110 so as to enable the hood to be removably connected to the body of the terminal 100.

Advantageous aspects of terminals 100 in accordance with the present disclosure are discussed separately below.

Ease of Installation and Maintenance

Embodiments of terminals 100 are designed so as to permit ready access to the interior of the terminal 100 and permit ready installation of the terminal 100 with limited or no use of specialized tools.

Embodiments provide an easily movable or removable access panel 104, whereby the access panel 104 is movably or removably connected to the front plate 102 such that the access panel 104 may be moved or removed in order to gain access to the interior of the terminal 104. In the embodiment shown in FIG. 18, the front panel 104 comprises a raised lip 1802 on a lower edge thereof that interlocks with a corresponding channel 1804 on a lower interior edge of the front plate 102. A locking protrusion 1806 is movably connected to the keyhole 106 such that the locking protrusion 1806 rotates as the keyhole 106 is turned. With the access panel 104 inserted in the front plate 102 and the locking protrusion 1806 in an upwards-extending position, the access panel 104 is secured to the front plate 102 and cannot be removed. To remove the access panel 104, the keyhole is actuated and rotated, causing the locking protrusion 1806 to rotate and disengage from the rim of the front panel 102. The access panel 104 can then be tilted away from the terminal 100 and entirely removed, leaving an opening in the front panel 102 through which the interior of the terminal 100 may be accessed. This ensures the interior of the terminal 100 cannot be accessed without actuating the keyhole 106 (i.e., by using the corresponding key) and that technicians can readily access the interior of the terminal 100.

In alternative embodiments, no hinges are used to movably connect the access panel 104 to the front plate 102; the lower portion of the access panel is secured by a lock channel to allow for easy removal of the panel completely. Other structures for providing a movable or removable access panel will be clear to one of skill in the art in view of the instant disclosure and are also expressly contemplated hereby.

As shown, the covering of the terminal 100 may be formed from multiple structural pieces that are bent, utilizing few if any welds and/or connectors. In the embodiment shown in FIG. 1, the front plate 102 and back plate 120 are each formed from a single piece of stamped metal that is bent into the desired shape before and therefor fit together. Similarly, the hood 110 is formed from a single piece of stamped metal before the inner baffle 1702 is welded to the hood, as shown in FIG. 17. In this manner, manufacturing costs and complexity may be greatly reduced.

In embodiments, the terminal 100 comprises a removable bottom plate 1202 on which the entire terminal 100 rests. Such configuration greatly improves the ease of installation of a terminal 100. In use, the bottom plate 1202 is positioned at a desired location and leveled. Inner opening 1206 may be located so as to allow cabling (not shown) to enter the terminal 100, including but not limited to pre-installed cabling to provide mains power and/or communication connections to the terminal 100. Outer openings 1204 are configured to permit fasteners (such as screws or bolts) to be driven through the bottom plate 1202 to secure the bottom plate 1202 in place. In embodiments, openings 1204 are curved so as to allow the bottom plate 1202 to be turned (e.g., to avoid rebar or other embedded obstacles within the substructure) and are extended so as to allow fasteners to be placed at preferred locations. The raised edge 1208 of the plate 1202 and notches 1210 serve to cooperatively receive the bottom edge 130b of the back plate 120 and/or front plate 102 so as to allow the terminal to be secured in place. In embodiments, fasteners may be used to further secure the terminal 100 to the bottom plate 1202.

The removable bottom plate 1202 beneficially enables the bottom plate 1202 to be easily located and levelled without the need to lift, move, and/or adjust the larger terminal 100 as a whole. Further, the ability to connect the terminal 100 to the bottom plate 1202 without tools enables faster installation.

Passive Cooling

In embodiments, the terminal 100 is passively cooled (i.e., does not incorporate any fans or other active cooling systems). Such configuration reduces the number of components (and thus component cost, installation complexity, and points of failure for the terminal) as well as the operating cost of the terminal (e.g., by reducing ongoing power requirements by eliminating the need to expend energy cooling the terminal 100). Embodiments contemplated hereby incorporate one or more of the following features.

As shown in FIG. 9, in embodiments, the top surface 128 of the hood 100 is angled. As will be clear to one of skill in the art, the top surface 128 is the portion of the terminal 100 that receives the greatest amount of solar radiation (and thus, solar heating). Angling the top surface 128 serves both to aid in expelling water from the top surface 128 prior to its evaporation (thereby keeping the top surface 128 cleaner and ensuring puddles of water do not form and gain entrance into the terminal 100) and in minimizing the thermal effect of solar radiation striking the top surface 128. The angle of the "tilt" ($\alpha$) of the top surface 128 may be determined based on the intended geographic location for installation of the terminal 100. By way of example, a terminal 100 intended for installation in Ottawa, Canada may utilize a lower degree of tilt than a terminal intended for installation in Miami, Fla. based on the lesser incidence of solar radiation at more northern latitudes. In embodiments, the tilt is greater than 26 degrees from the horizontal. In alternative embodiments, the tilt is between approximately 40 and 50 degrees from horizontal. In the embodiment shown in FIG. 18, the top surface is angled 135 degrees from vertical (i.e., it is tilted "upwards" 45 degrees above horizontal).

In contrast, in embodiments, the front plate 102 and upper back plate 122 are substantially vertical, thereby minimizing the area receiving solar radiation on the surfaces thereof.

Figure 1:
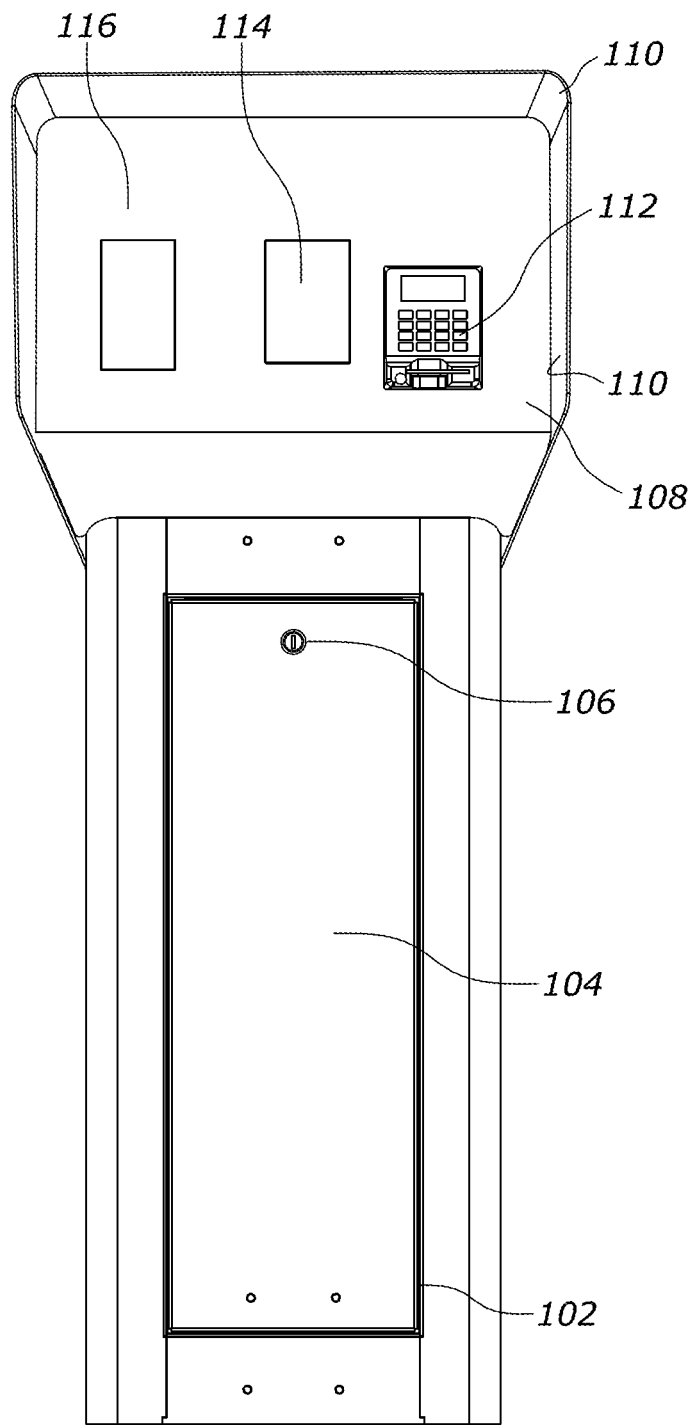
Figure 2:
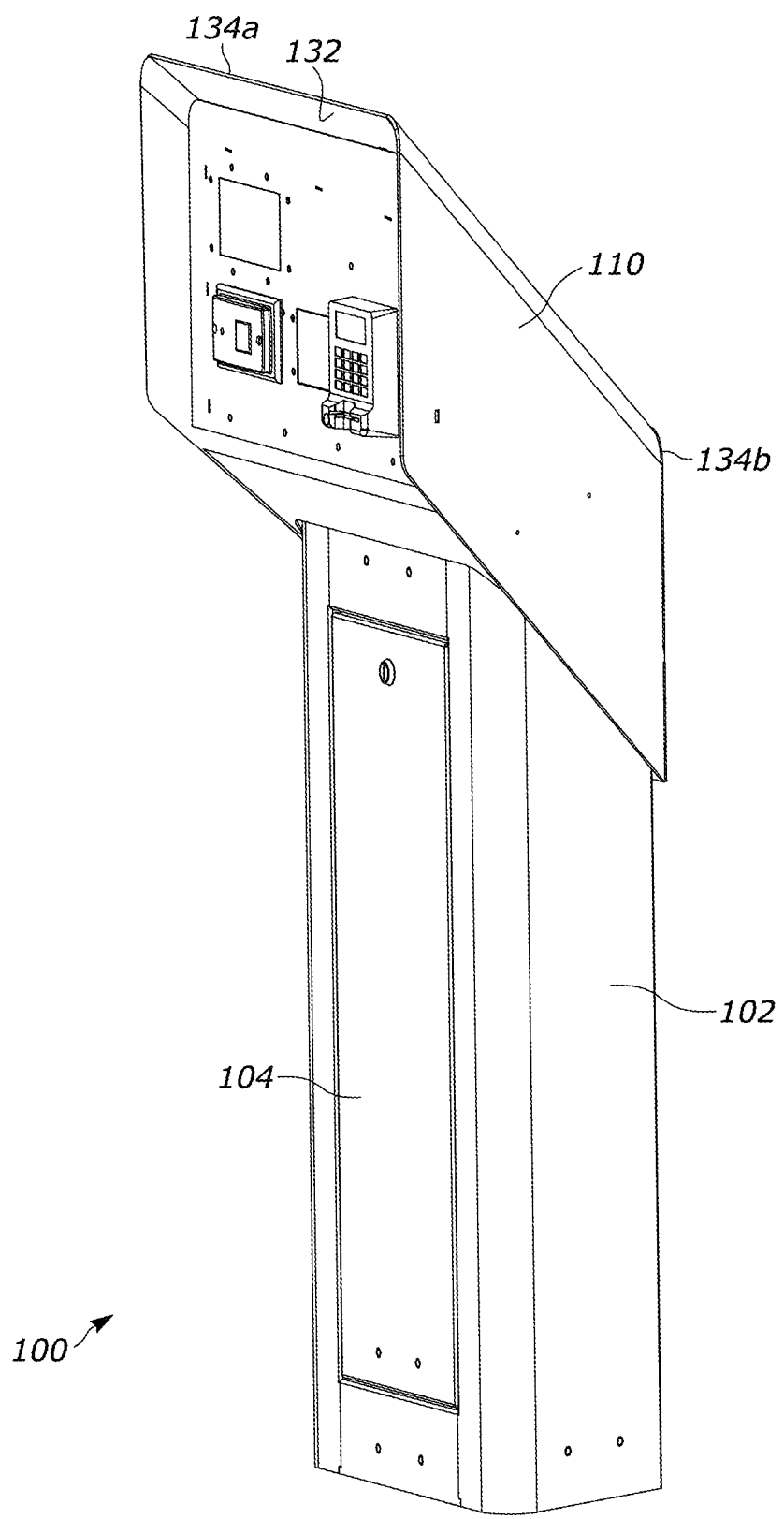
FIG. 2 is a side perspective view of the terminal of FIG. 1.
Figure 3:
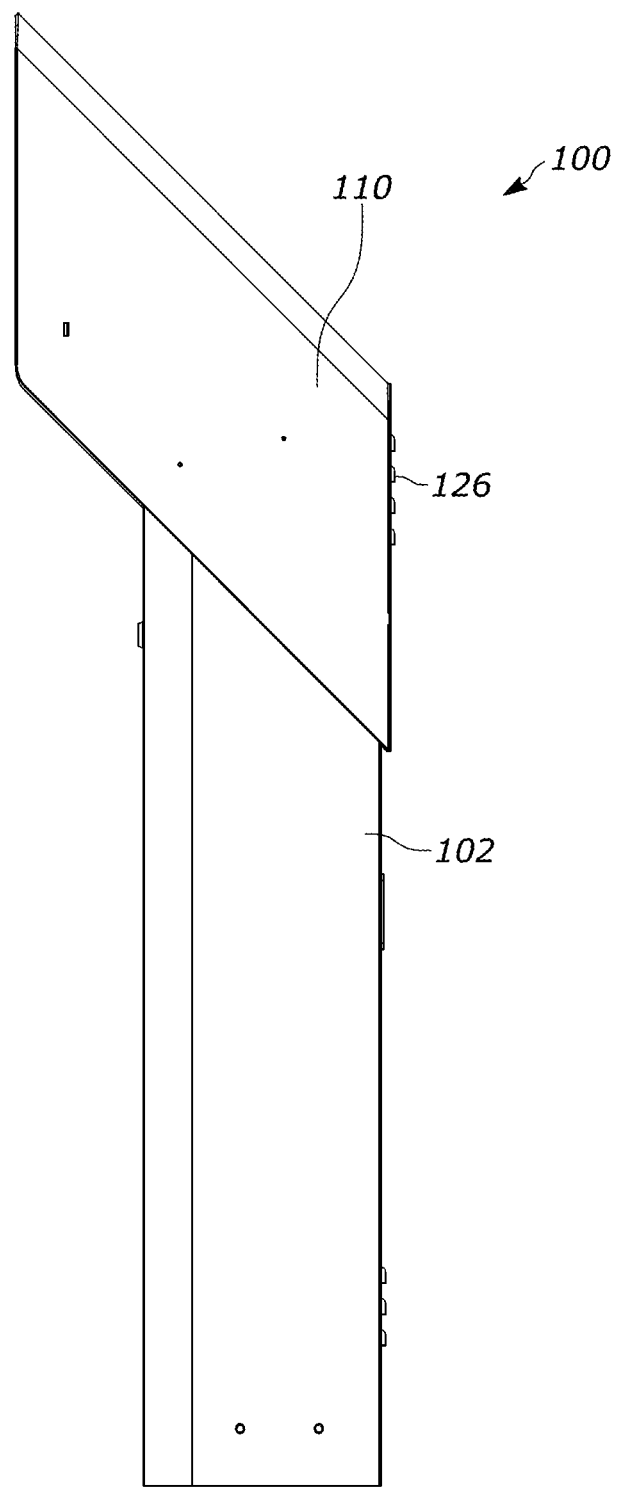
FIG. 3 is a side view of the terminal of FIG. 1.
Figure 4:
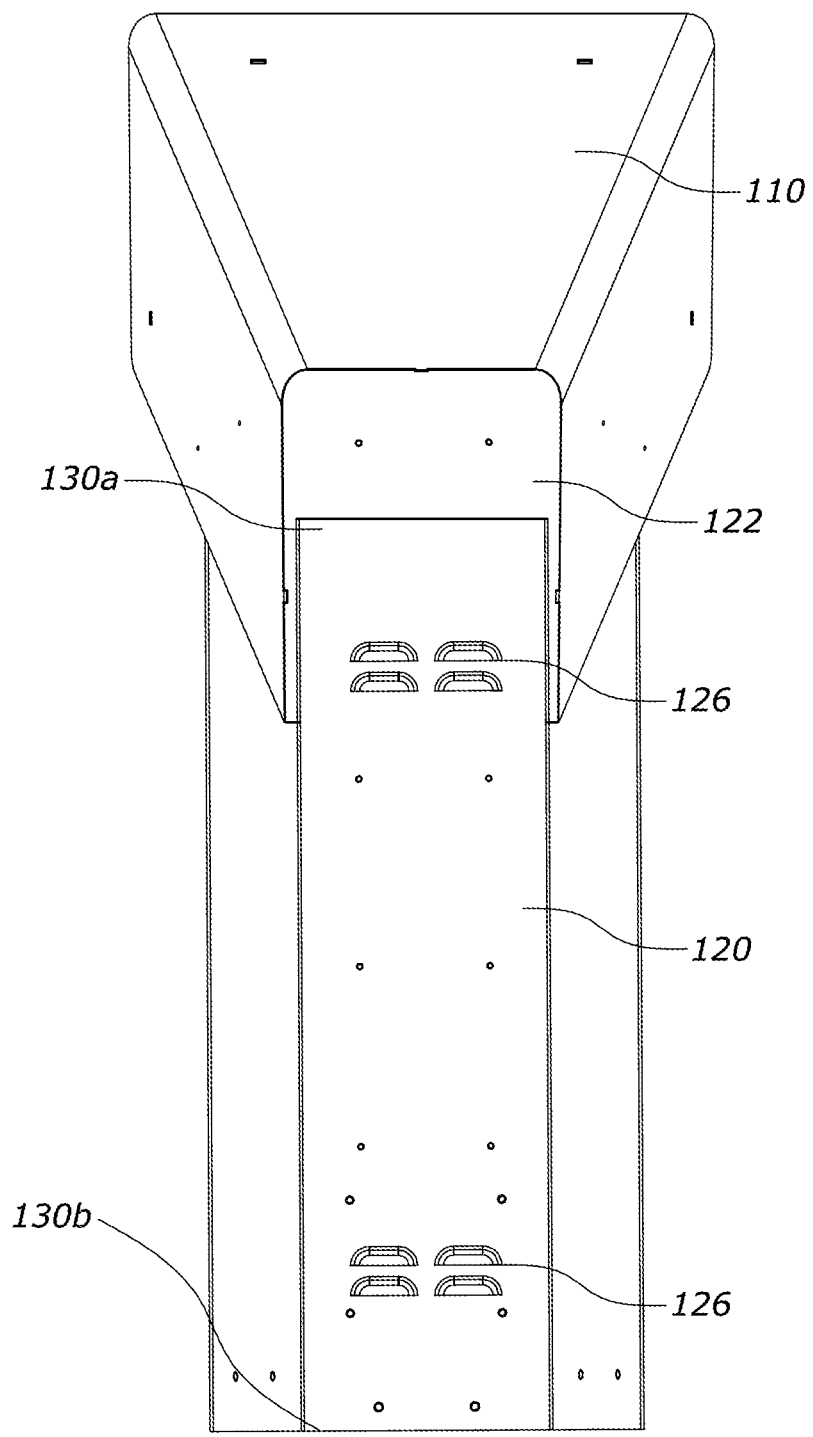
FIG. 4 is a back view of the terminal of FIG. 1.
Figure 5A:
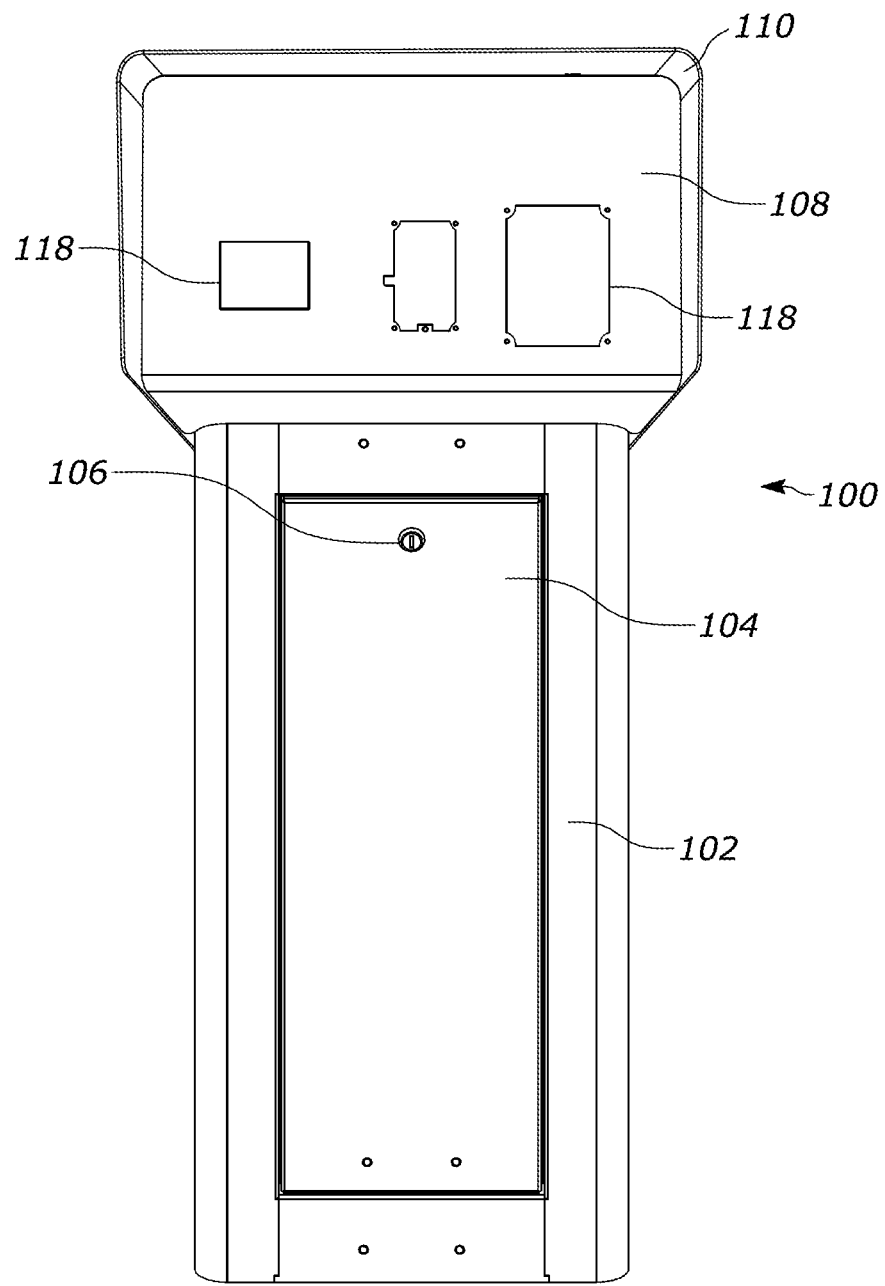
FIG. 5A is a front view of a terminal with the internal electronics omitted.
Figure 5B:
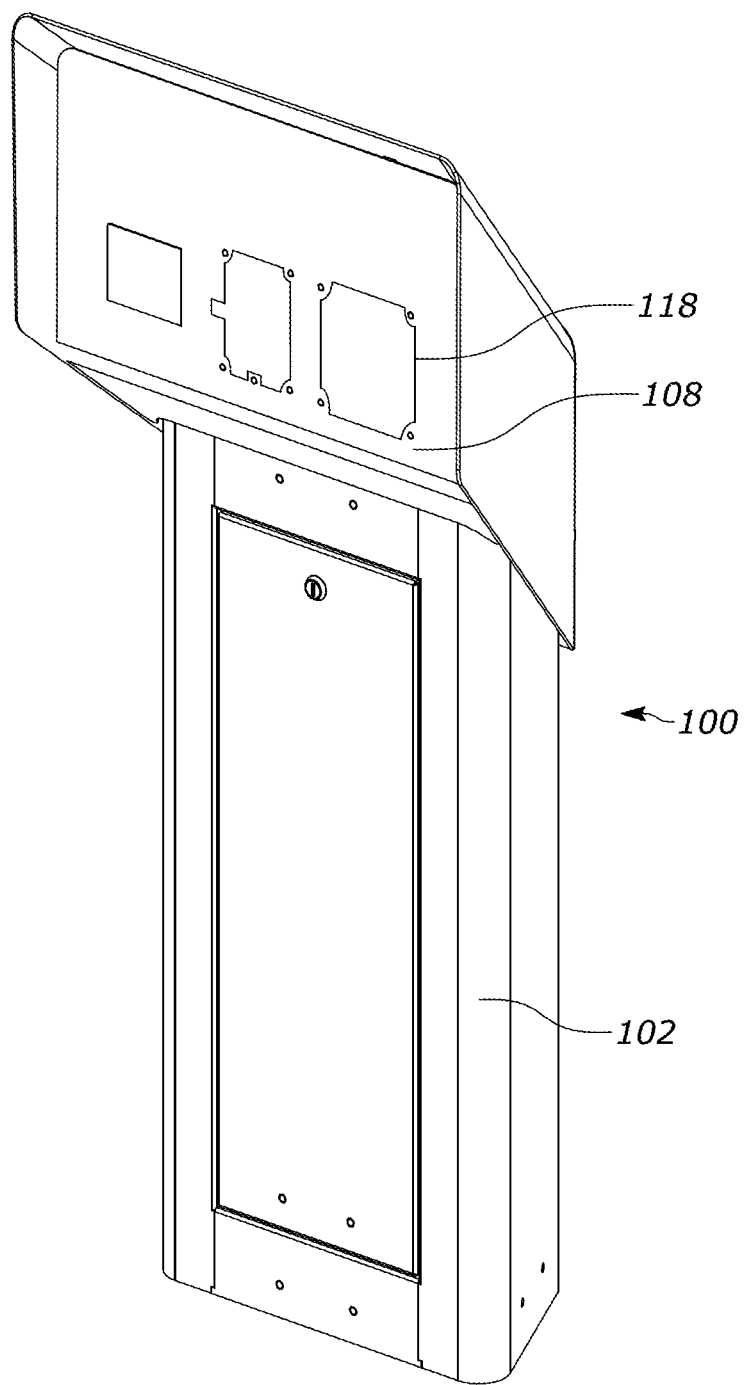
FIG. 5B is a side perspective view of the terminal of FIG. 5.
Figure 6:
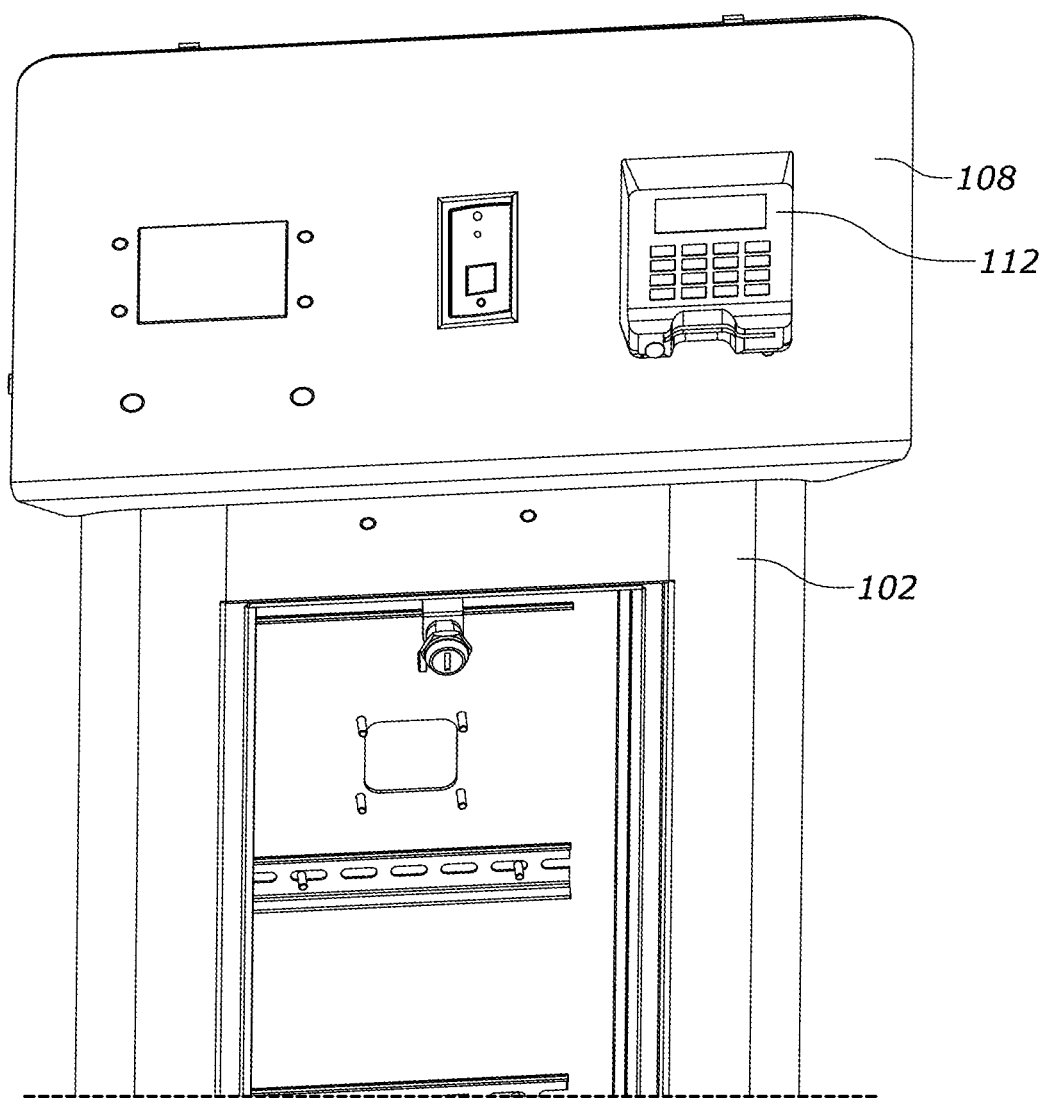
FIG. 6 is a front view of a second embodiment of a terminal with the outer covering removed.

As shown in FIG. 1, in embodiments the hood 110 extends over the inner panel 108 such that the hood 110 provides a degree of shading to the inner panel 108. In embodiments, that overhang may be increased (e.g., to provide greater shading to the inner panel 108).

To further aid in dissipating solar radiation, the exterior surface of the terminal 100 may be a light or reflective color, such that solar radiation is reflected away from the terminal 100. In the embodiment shown in FIG. 18, the hood 110 (including top surface 128) and front panel 102 are painted or otherwise colored to the RAL-9010 shade of white while the inner panel 108 is painted or otherwise colored to the RAL-9006 shade of aluminum grey.

In embodiments, vents 126 are provided in the back plate 120. In the embodiment shown in FIG. 4, a first set of vents 126 are disposed proximate the top edge 130a of the back plate 120 while a second set of vents 126 are disposed proximate a lower edge 130b of the back plate 120. The first set of vents 126 is thereby located above the controller 1002 while the second set of vents 126 is disposed below the controller 1002. In the embodiment shown, both sets of vents 126 serve as air intakes, allowing ambient air to enter the terminal 100 therethrough. As the ambient air is warmed (e.g., through waste heat generated by the electrical components disposed within the terminal and/or solar radiation impacting the exterior surface of the terminal 100), it rises through the interior of the terminal 100 before being expelled through a top vent 802 disposed between the top edge 132 of the interior panel 104 and the hood 110, as shown in FIG. 11. Vents 126, 802 are comprised of openings to permit the passage of air.

The hood 110 is angled such that a front edge 134a is wider than a back edge 134b. In the preferred embodiment, the angle between the sides of the hood 110 ($a$) is between approximately 40 and 50 degrees. This aids in creating a chimney effect whereby air exiting through the top vent 802 creates a lower pressure zone that accelerates the flow of air through the terminal 100 (and along the surfaces of the electrical components disposed therein), increasing the effective cooling rate. In embodiments, the top vent 802 extends along the entire edge 132 of the interior panel 108. In alternative embodiments, one or more top vents 802 are located along a portion of the edge 132.

Water Redistribution

In embodiments, the exterior of the terminal 100 is made from a waterproof material (such as metal or plastic). In further embodiments, the terminal 100 is specifically designed to ensure water entering the terminal 100 is expelled without accessing electrical or other sensitive components. As shown in FIG. 7, in an embodiment, a back channel 708 is angled across the interior surface of the inner panel 108 and protrudes horizontally towards the back of the terminal 100. The back channel 708 functions as a gutter, catching water that gains entrance to the terminal 100 around the edges of the inner panel 108 and directing it down towards a lower corner of the inner panel 108 to drain out of the terminal 100. In embodiments, water may enter through a top opening 802 and is expelled through a bottom opening 804 disposed between the inner panel 108 and hood 110.

Fourth Embodiment

FIG. 19 illustrates an exploded view of a fourth embodiment of a terminal 1900 that is generally similar to terminal 100 except as otherwise noted herein.

As shown, the terminal comprises a base 1200 that is joined to a base plate 1202 during installation. The base 1200 is placed at a desired location (e.g., such that preinstalled cabling is accessible through the central opening thereof) and leveled. The base plate 1202 is then fastened thereto, which in turn supports the back plate 1920, front plate 1902, doorframe 1940, and beam 1942. Service panel 1904 is removably secured to the front plate 1902 and features a locking mechanism 1906. Back plate cap 1922 is disposed on top of the back plate 1920 and front plate 1902, and is in turn secured to the bot plate 1918 which supports one or more devices. As shown, the devices comprise card reader 1912 and one or more plastic windows behind which further devices (such as an RFID reader and/or optical reader 1914, 1916) may be disposed. Upper back plate 1922 is placed above back plate 1920 while cover 1910 (which is generally similar to hood 110) covers the bot plate 1918 and back cover 1920.

Fifth Embodiment

FIGS. 20 through 26 illustrate a fifth embodiment of a terminal 2100 that is generally similar to terminal 100 except as otherwise noted herein.

As shown, components of the terminal 2100 are affixed together using one or more fasteners 2102. The terminal 2100 comprises a single set of vents 126 located proximate the lower edge 130*b* of the back plate 120. These vents 126 draw in ambient air, which then is heated and rises through the terminal before being expelled through top vent 802.

Sixth Embodiment

FIGS. 27 through 43 illustrate a sixth embodiment of a terminal 2800 that is generally similar to terminals 100, 1900, and 2100 except as otherwise noted herein. Unless otherwise noted, similarly labeled elements refer to similar components (i.e., front plate 102, 2802).

As depicted in FIGS. 27 through 43, the terminal 2800 comprises a front plate 2802, front access panel 2804, hood 2810, inner panel 2808, back plate 2820, and upper back plate 2822 that cooperatively forms the exterior surface of the terminal 2800. As is clear to one of skill in the art, in alternative embodiments, the foregoing components may each comprise multiple elements or may be combined into single physical structures. For example, in an embodiment, the front plate 2802 comprises multiple plates that are separately formed before being jointed together and similarly the back plate 2820 and upper back plate 2822 are jointed together to form the back face of the terminal 2800. Other alternative arrangements will be clear to one of skill in the art from the present disclosure.

One or more devices may be disposed along inner panel 2808. In the embodiment depicted in FIGS. 27 and 28, a scanner/reader 2816 for reading the barcode of a card, paper, or mobile device; an RFID reader 2814 for optically reading a radio-frequency ID (RFID) and/or near field communication (NFC); and a credit card reader and PIND pad 2812 are each disposed on the inner panel 2808.

As depicted in FIGS. 27 through 43, the inner panel 2808 further comprises a display (or screen) 2824. In the preferred embodiment, the display 2824 is located proximate the top left corner of the inner panel 108. In the preferred embodiment, the display 2824 is located above the first card reader 112, second card reader 114, and barcode reader 116.

As depicted in FIG. 40, the inner panel is comprised of a cutout 2818 with portions for placement of the first card reader 2812, second card reader 2814, and barcode reader 2816. These devices are held in place by a frame 4102. Further, a display box 4112 is located within the housing of the hood 2810 and connects to the interior of the cutoff 2818. The display box 4112 comprises a display screen 2824 as well as housing for the components necessary for the display screen 2824 to function.

As will be clear to one of skill in the art, and as shown in FIGS. 29 through 43, other arrangements and/or combinations of devices may also or instead be disposed on the inner panel 2808. Each of the devices 2812, 2814, 2816, and 2824 are coupled to a controller 1002 and power supply (not shown), which may be provided through electrical means and/or a battery, such as through wiring (not shown, but as described in the main embodiment 706). A central channel (not shown, but as described in the main embodiment 704) in the terminal 2800 permits the routing of cabling 706 between components as well as the flow of air through the terminal 2800. In one embodiment, one or more speakers (not shown, but as described in the main embodiment 702) and/or microphones are disposed along the inner panel 2808. In embodiments, channels 1602 are configured to receive corresponding protrusions on the hood 2810 so as to enable the hood 2810 to be removably connected to the body of the terminal 2800.

Installation and Maintenance

The terminal 2800 is configured so as to permit ready access to the interior of the terminal 2800 and permit ready installation 2800 with limited or no use of specialized tools.

In the preferred embodiment, the terminal 2800 comprises an easily movable or removable access panel 2804, whereby the access panel 2804 may be moved or removed in order to gain access to the interior of the terminal 2804.

In the embodiment depicted in FIG. 40, a bottom bracket 4104 connects to the lower edge of the front panel 2804 and interlocks with a corresponding channel 4106 on a lower interior edge of the front plate 2802. A locking protrusion 4108 is movably connected to the keyhole 2806 such that the locking protrusion 4108 rotates as the keyhole 2806 is turned. The locking protrusion 4108 corresponds to a corresponding locking portion 4110. With the access panel 2804 inserted in the front plate 2802 and the locking protrusion 4108 in an upwards extending position, the access panel 2804 is secured to the front plate 2802 and cannot be removed. To remove the access panel 2804, the keyhole is actuated and rotated, causing the locking protrusion 4108 to rotate and disengage from the locking portion 4110. The access panel 2804 can then be tilted away from the terminal 2800 and entirely removed, leaving an opening in the front panel 2802 through which the interior of the terminal 2800 may be accessed. This ensures the interior of the terminal 2800 cannot be accessed without actuating the keyhole 2806 (i.e., by using the corresponding key). By using a corresponding key, technicians can readily access the interior of the terminal 2800.

In alternative embodiments, no hinges are used to movably connect the access panel 2804 to the front plate 2802; the lower portion of the access panel 2804 is secured by a lock channel to allow for easy removal of the panel 2804 completely. Other structures for providing a movable or removable access panel 2804 will be clear to one of skill in the art in view of the instant disclosure and are also expressly contemplated hereby.

In an embodiment, the interior of the terminal 2800 further comprises a plurality of beams 4114 for additional attachments, such as the controller 1002. The beams 4114 allow for the controller 1002 or other attachments to be positioned in alternative locations.

In the preferred embodiment, the terminal 2800 further comprises a back access panel 2836 which is secured to the back plate 2820 by fasteners 2824. The back access panel 2836 is removable to provide access to the interior of the terminal 2800 and/or to increase the circulation of ambient air through the terminal 2800.

In one embodiment of the terminal 2800, the covering of the terminal 2800 may be formed from multiple structural pieces that are bent, utilizing few welds and/or connectors. In such embodiment, the front plate 2802 and back plate 2820 are each formed from a single piece of stamped metal that is bent into a desired shape before and therefor fit together. Similarly, the hood 2810 is formed from a single piece of stamped metal before the inner baffle 1702 is welded to the hood.

Alternatively, the terminal 2800 may be comprised of several separate pieces stamped from multiple sheets of metal and secured with fasteners 2824.

In the preferred embodiment, the terminal 2800 comprises a removable bottom plate 1202 (as described above) on which the entire terminal 2800 rests. Such configuration greatly improves the ease of installation of a terminal 2800. In use, the bottom plate 1202 is positioned at a desired location and leveled. Inner opening 1206 may be located so as to allow cabling 702 to enter the terminal 2800, including but not limited to pre-installed cabling 702 to provide mains power and/or communication connections to the terminal 2800. Outer openings 1204 are configured to permit fasteners 2824 (such as screws and bolts) to be driven through the bottom of the plate 1202 to secure the bottom plate 1202 in place. In embodiments, openings 1204 are curved so as to allow the bottom plate 1202 to be turned (e.g., to avoid rebar or other embedded obstacles within the substructure) and are extended so as to allow fasteners to be placed at preferred locations. The raised edges 1208 of the plate 1202 and notches 1210 serve to cooperatively receive the bottom edge 2830*b* of the back plate 2820 and/or front plate 2802 so as to allow the terminal 2800 to be secured in place. In embodiments, fasteners 2824 may be used to further secure the terminal 2800 to the bottom plate 1202.

The removable bottom plate 1202 beneficially enables the bottom plate 1202 to be easily located and levelled without the need to lift, move, and/or adjust the larger terminal 2800 as a whole. Further, the ability to connect the terminal 2800 to the bottom plate 1202 without tools enables faster installation.

Passive Cooling

In a preferred embodiment, the terminal 2800 is passively cooled. Such configuration reduces the number of components (and thus component cost, installation complexity, and points of failure for the terminal) as well as the operating cost of the terminal 2800 (e.g., by reducing the ongoing power requirements by eliminating the need to expend energy cooling the terminal 2800). Embodiments contemplated hereby incorporate one or more of the following features.

In the embodiments depicted in FIGS. 27 through 43, the top surface 2828 of the hood 2810 is angled. As will be clear to one of skill in the art, the top surface 2828 is the portion of the terminal that receives the greatest amount of surface radiation. Angling the top surface 128 serves both to aid in expelling water from the top surface 2828 prior to its evaporation and in minimizing the thermal effect of solar radiation striking the top surface 2828. The angle of the "tilt" ($\alpha$) of the top surface 2828 may be determined based on the intended geographic location of the terminal 2800. In embodiments, the tilt is greater than 26 degrees from the horizontal. In alternative embodiments, the tilt is between approximately 40 and 50 degrees from the horizontal.

In contrast, the front plate 2802 and back plate 2822 are substantially vertical, thereby minimizing the area receiving solar radiation on the surfaces thereof.

As depicted in FIGS. 27 through 43, the hood 2810 extends over the inner panel 2808 such that the hood 2810 provides shading to the inner panel 2808. In embodiments, the hood 2810 is adjustable to increase the amount of shading provided to the inner panel 2808.

To further aid in dissipating solar radiation, the exterior surface of the terminal 2800 may be a light or reflective color, such that solar radiation is reflected away from the terminal 2800. In the preferred embodiment, the hood 2810 and front panel 2802 are painted or otherwise colored to the RAL-9010 shade of white while the inner panel 2808 is painted or otherwise colored to the RAL-9006 shade of aluminum grey.

In addition, vents 2826 are located along the back plate 2820. In the preferred embodiment, a set of vents 2826 are disposed proximate the lower edge 2830*b* of the back plate 2820. In the embodiment depicted, the vents 2826 serve as air intake ports, allowing ambient air to enter the terminal 2800 therethrough. As the ambient air is warmed, it rises through the interior of the terminal 2800 before being expelled through a top vent 802 disposed between the top edge 2832 of the interior panel 2808 and the hood 2810. Vents 2826, 802 are comprised of openings to permit the passage of air.

The hood 2810 is angled such that the front edge 2834*a* is wider than the back edge 2834*b*. In the preferred embodiment, the angle between the sides of the hood 2810 ($\sigma$) is between approximately 40 and 50 degrees. This aids in creating a chimney effect whereby air exiting through the top vent 802 creates a lower pressure zone that accelerates the flow of air through the terminal 2800 (and along the surfaces of the electrical components disposed therein), increasing the effective cooling rate. In embodiments, the top vent 802 extends along the entire edge 2832 of the interior panel 2808. In alternative embodiments, one or more vents 802 are located along the top edge 2832.

Water Redistribution

In embodiments, the exterior of the terminal 2800 is made from a waterproof material. In further embodiments, the terminal 2800 is specifically designed to ensure water entering the terminal 2800 is expelled without accessing electrical or other sensitive components. In an embodiment, a back channel 708 is angled across the interior surface of the inner panel 2808 and protrudes horizontally towards the back of the terminal 2800. The back channel 708 functions as a gutter, catching water that gains entrance to the terminal 2800 around the edges of the inner panel 108 to drain out of the terminal 2800. In embodiments, water may enter through a top opening 802 and is expelled through a bottom opening 804 disposed between the inner panel 2808 and hood 2810.

The foregoing examples have been provided merely for the purpose of explanation and are in no way to be construed as limiting of the present invention disclosed herein. While the invention has been described with reference to various embodiments, it is understood that the words, which have been used herein, are words of description and illustration, rather than words of limitation. Further, although the invention has been described herein with reference to particular means, materials, and embodiments, the invention is not intended to be limited to the particulars disclosed herein;

rather, the invention extends to all functionally equivalent structures, methods, and uses, such as are within the scope of the appended claims. Those skilled in the art, having the benefit of the teachings of this specification, may affect numerous modifications thereto and changes may be made without departing from the scope and spirit of the invention in its aspects.

Any other undisclosed or incidental details of the construction or composition of the various elements of the disclosed embodiment of the present invention are not believed to be critical to the achievement of the advantages of the present invention, so long as the elements possess the attributes needed for them to perform as disclosed. Certainly, one skilled in the art would be able to conceive of a wide variety of alternatives and system configurations and successful combinations thereof. The selection of these and other details of construction are believed to be well within the ability of one of even rudimental skills in this area, in view of the present disclosure. Illustrative embodiments of the present invention have been described in considerable detail for the purpose of disclosing a practical, operative structure whereby the invention may be practiced advantageously. The designs described herein are intended to be exemplary only. The novel characteristics of the disclosure may be incorporated in other structural forms without departing from the spirit and scope of the invention. The invention encompasses embodiments both comprising and consisting of the elements described with reference to the illustrative embodiments. Unless otherwise indicated, all ordinary words and terms used herein shall take on their customary meaning. All technical terms shall take on their customary meaning as established by the appropriate technical discipline utilized by those normally skilled in that particular art area.

The invention claimed is:

1. A parking terminal comprising:
    a bottom plate;
    a body;
    a first vent located on a back plate of the body of the terminal;
    a front panel;
    a hood; and
    an electronic access control mechanism that, based on interaction with the parking terminal by a human, transmits electronic instructions to one or more hardware components that regulate vehicle traffic with respect to a parking facility, the one or more hardware components not physically connected to the parking terminal;
    wherein the bottom plate is configured to be secured to a surface, the body is removably attached to the bottom plate and the front panel and the hood are supported by the body.

2. The parking terminal of claim 1, wherein the hood comprises a top surface which forms an angle a from a horizontal axis.

3. The parking terminal of claim 2, wherein the angle a is approximately equal to or at least 26 degrees.

4. The parking terminal of claim 2, wherein the angle a is between approximately 40 and approximately 50 degrees.

5. The parking terminal of claim 2, further comprising:
    a drain outlet located proximate a first side of the front panel; and
    a channel disposed on an interior surface of the front panel.

6. The parking terminal of claim 5, further comprising a baffle located on an inner surface of the hood proximate the front panel.

7. The parking terminal of claim 1, the terminal further comprising a second vent located between the hood and the front panel.

8. The parking terminal of claim 1, the terminal further comprising a frame, wherein the one or more hardware components are removably attached to the frame and wherein the frame is supported by the body.

9. The parking terminal of claim 8, wherein the one or more devices disposed on the front panel comprise a bar code reader, an RFID reader, and a credit card reader.

10. The parking terminal of claim 9, wherein the front panel further comprises a display.

11. The parking terminal of claim 10, wherein the display comprises a touch screen.

12. The parking terminal of claim 1, wherein the hood comprises a first side, a second side, and a top surface and the first side and the second side form an angle σ therebetween and wherein the angle σ is between approximately 40 and approximately 50 degrees.

13. The parking terminal of claim 1, further comprising:
    an opening in the bottom plate; and
    a passage in the body aligned with the opening.

14. A method of installing a parking terminal comprising a bottom plate, a body, a first vent located on a back plate of the body of the terminal a front plate adapted to receive one or more devices, and a hood, the method comprising steps of:
    selecting a location for installation of the terminal;
    leveling a surface at the location;
    positioning the bottom plate at the location;
    securing the bottom plate in place at the location;
    aligning a lower edge of the body with the bottom plate;
    securing the body to the bottom plate;
    securing the front plate to the body; and
    securing the hood to the body, wherein the location is a parking facility, and wherein the parking terminal comprises an electronic access control mechanism that, based on interaction with the parking terminal by a human, transmits electronic instructions to one or more hardware components that regulate vehicle traffic with respect to a parking facility, the one or more hardware components not physically connected to the parking terminal.

15. The method of claim 14, wherein the bottom plate comprises a vertical support extending around at least a portion of a perimeter of the bottom plate and the step of aligning the lower edge of the body with the bottom plate comprises aligning the body with the vertical support.

16. The method of claim 15, wherein the bottom plate comprises an opening and the body comprises a passageway, the method further comprising the steps of prior to positioning the bottom plate at the location, installing cabling at the location and routing the cabling through the opening in the bottom plate;
    prior to aligning the lower edge of the body with the bottom plate, routing the cabling through the passageway within the terminal body;
    attaching the cabling to a controller within the body; and
    communicatively coupling the controller to the one or more devices.

17. A method of servicing a parking terminal comprising a bottom plate, a body having a front and rear access panel, a first vent located on a back plate of the body of the terminal, a front panel adapted to receive one or more devices, and a hood, the method comprising steps of:
- opening the front access panel by rotating a key in a key slot located in the front access panel;
- accessing an interior of the body;
- closing the front access panel; and
- locking the front access panel, wherein the location is a parking facility, and wherein the parking terminal comprises an electronic access control mechanism that, based on interaction with the parking terminal by a human, transmits electronic instructions to one or more hardware components that regulate vehicle traffic with respect to a parking facility, the one or more hardware components not physically connected to the parking terminal.

18. The method of claim 17, further comprising the steps of:
- removing the hood from the body;
- removing at least one of the one or more devices; and
- replacing the hood on the body.

19. The method of claim 17, further comprising the steps of detaching the body from the bottom plate;
- accessing cabling located proximate the bottom plate; and
- reattaching the body on the bottom plate.

* * * * *